US010347460B2

(12) United States Patent
Zhao et al.

(10) Patent No.: US 10,347,460 B2
(45) Date of Patent: Jul. 9, 2019

(54) PATTERNED SUBSTRATE IMAGING USING MULTIPLE ELECTRON BEAMS

(71) Applicant: Dongfang Jingyuan Electron Limited, Beijing (CN)

(72) Inventors: Yan Zhao, San Jose, CA (US); Weiqiang Sun, Beijing (CN); Tao Feng, Beijing (CN)

(73) Assignee: Dongfang Jingyuan Electron Limited, Beijing (CN)

( * ) Notice: Subject to any disclaimer, the term of this patent is extended or adjusted under 35 U.S.C. 154(b) by 0 days.

(21) Appl. No.: 15/872,570

(22) Filed: Jan. 16, 2018

(65) Prior Publication Data

US 2018/0254167 A1    Sep. 6, 2018

Related U.S. Application Data

(60) Provisional application No. 62/465,303, filed on Mar. 1, 2017.

(51) Int. Cl.
*H01J 37/147* (2006.01)
*H01J 37/20* (2006.01)
*H01J 37/22* (2006.01)
*H01J 37/12* (2006.01)
*H01J 37/244* (2006.01)
(Continued)

(52) U.S. Cl.
CPC .......... *H01J 37/1475* (2013.01); *H01J 37/12* (2013.01); *H01J 37/145* (2013.01); *H01J 37/20* (2013.01); *H01J 37/222* (2013.01); *H01J 37/244* (2013.01); *H01J 37/28* (2013.01); *H01J 2237/04* (2013.01); *H01J 2237/0453* (2013.01); *H01J 2237/152* (2013.01);
(Continued)

(58) Field of Classification Search
CPC ...... H01J 37/1475; H01J 37/12; H01J 37/145; H01J 37/20; H01J 37/222; H01J 37/244; H01J 37/28; H01J 2237/04; H01J 2237/0453; H01J 2237/152; H01J 2237/202; H01J 2237/24475; H01J 2237/2817
USPC .......................... 250/306, 307, 309, 310, 311
See application file for complete search history.

(56) References Cited

U.S. PATENT DOCUMENTS 5,430,292 A    7/1995 Honjo et al.
5,892,224 A    4/1999 Nakasuji
(Continued)

*Primary Examiner* — Nicole M Ippolito
(74) *Attorney, Agent, or Firm* — Young Basile Hanlon & MacFarlane, P.C.

(57) ABSTRACT

A method for imaging a surface of a substrate using a multi-beam imaging system includes: modifying an electron beam using a multipole-field device; generating beamlets from the electron beam using a beam-splitting device having multiple apertures; in response to projecting foci of the beamlets onto the surface, driving the beamlets using a deflector set to scan a region of the surface for receiving signals based on electrons scattered from the region; and determining an image of the region for inspection based on the signals. The multi-beam imaging system includes: an electron source; a first multipole-field device for beam shaping and beam aberration correction; a beam-splitting device; a projection lens set; a deflector set; an objective lens set; a detector array; a second multipole-field device; a processor; and a memory storing instructions to determine an image of the region for inspection based on the signals.

21 Claims, 14 Drawing Sheets

(51) Int. Cl.
*H01J 37/145* (2006.01)
*H01J 37/28* (2006.01)

(52) U.S. Cl.
CPC .............. *H01J 2237/202* (2013.01); *H01J 2237/24475* (2013.01); *H01J 2237/2817* (2013.01)

(56) References Cited

U.S. PATENT DOCUMENTS

| | | | |
|---|---|---|---|
| 6,617,587 B2 | 9/2003 | Parker et al. |
| 6,734,428 B2 | 5/2004 | Parker et al. |
| 6,750,455 B2 | 6/2004 | Lo et al. |
| 6,903,353 B2 | 6/2005 | Muraki et al. |
| 6,943,349 B2 | 9/2005 | Adamec et al. |
| 7,012,251 B2 | 3/2006 | Nakasuji et al. |
| 7,067,809 B2 | 6/2006 | Lo et al. |
| 7,084,406 B2 | 8/2006 | Knippelmeyer |
| 7,095,022 B2 | 8/2006 | Nakasuji et al. |
| 7,129,485 B2 | 10/2006 | Nakasuji et al. |
| 7,129,502 B2 | 10/2006 | Kruit |
| 7,135,675 B1 | 11/2006 | Adler |
| 7,135,676 B2 | 11/2006 | Nakasuji et al. |
| 7,157,703 B2 | 1/2007 | Nakasuji et al. |
| 7,205,559 B2 | 4/2007 | Hamashima et al. |
| 7,244,932 B2 | 7/2007 | Nakasuji et al. |
| 7,244,949 B2 | 7/2007 | Knippelmeyer et al. |
| 7,262,418 B2 | 8/2007 | Lo et al. |
| 7,348,567 B1 | 3/2008 | Kruit |
| 7,365,338 B2 | 4/2008 | Kruit |
| 7,385,197 B2 | 6/2008 | Nakasuji et al. |
| 7,391,033 B1 | 6/2008 | Adler |
| 7,391,037 B2 | 6/2008 | Kruit |
| 7,423,267 B2 | 9/2008 | Nakasuji et al. |
| 7,425,703 B2 | 9/2008 | Nakasuji et al. |
| 7,439,502 B2 | 10/2008 | Nakasuji et al. |
| 7,569,833 B2 | 8/2009 | Kruit |
| 7,576,917 B2 | 8/2009 | Lanio |
| 7,888,642 B2 | 2/2011 | Nakasuji et al. |
| 7,906,761 B2 | 3/2011 | Tanimoto et al. |
| 7,928,403 B2 | 4/2011 | Adamec |
| 8,003,953 B2 | 8/2011 | Chen et al. |
| 8,039,813 B2 | 10/2011 | Casares et al. |
| 8,097,847 B2 | 1/2012 | Knippelmeyer et al. |
| 8,158,954 B2 | 4/2012 | Lanio |
| 8,193,493 B2 | 6/2012 | Tanimoto et al. |
| 8,330,103 B2 | 12/2012 | Enyama et al. |
| 8,350,214 B2 | 1/2013 | Otaki et al. |
| 8,362,425 B2 | 1/2013 | Han et al. |
| 8,368,015 B2 | 2/2013 | Platzgummer et al. |
| 8,368,030 B2 | 2/2013 | Platzgummer et al. |
| 8,445,862 B2 | 5/2013 | Chen et al. |
| 8,455,838 B2 | 6/2013 | Shadman et al. |
| 8,481,958 B2 | 7/2013 | Lanio |
| 8,546,767 B2 | 10/2013 | Platzgummer et al. |
| 8,552,373 B2 | 10/2013 | Enyama et al. |
| 8,637,834 B2 | 1/2014 | Knippelmeyer et al. |
| 8,791,425 B2 | 7/2014 | Ren et al. |
| 8,907,278 B2 | 12/2014 | Enyama et al. |
| 9,040,910 B2 | 5/2015 | Luo |
| 9,136,091 B2 | 9/2015 | Kimba et al. |
| 9,224,576 B2 | 12/2015 | Knippelmeyer et al. |
| 9,263,233 B2 | 2/2016 | Zeidler et al. |
| 9,324,537 B2 | 4/2016 | Kemen et al. |
| 9,336,981 B2 | 5/2016 | Knippelmeyer |
| 9,431,209 B2 | 8/2016 | Ren et al. |
| 2002/0130262 A1 | 9/2002 | Nakasuji et al. |
| 2010/0065753 A1* | 3/2010 | Enyama .............. H01J 37/1472 250/397 |
| 2017/0154756 A1* | 6/2017 | Ren .................... H01J 37/14 |

* cited by examiner

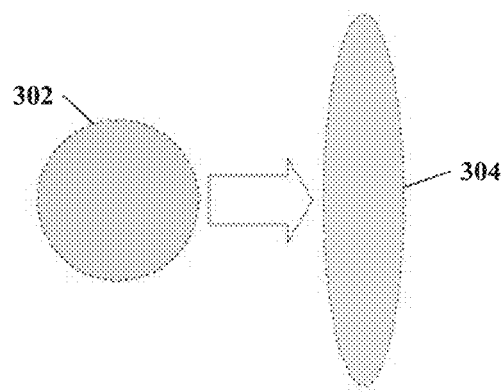
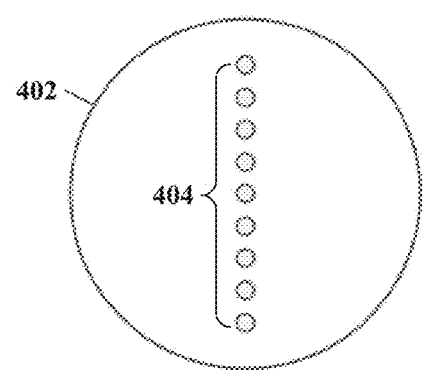
FIG. 3
FIG. 4A
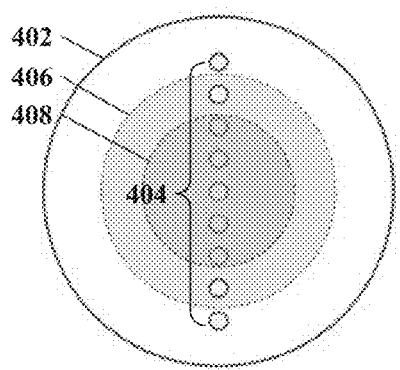
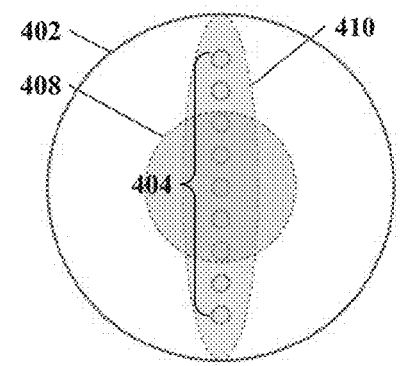
FIG. 4B
FIG. 4C

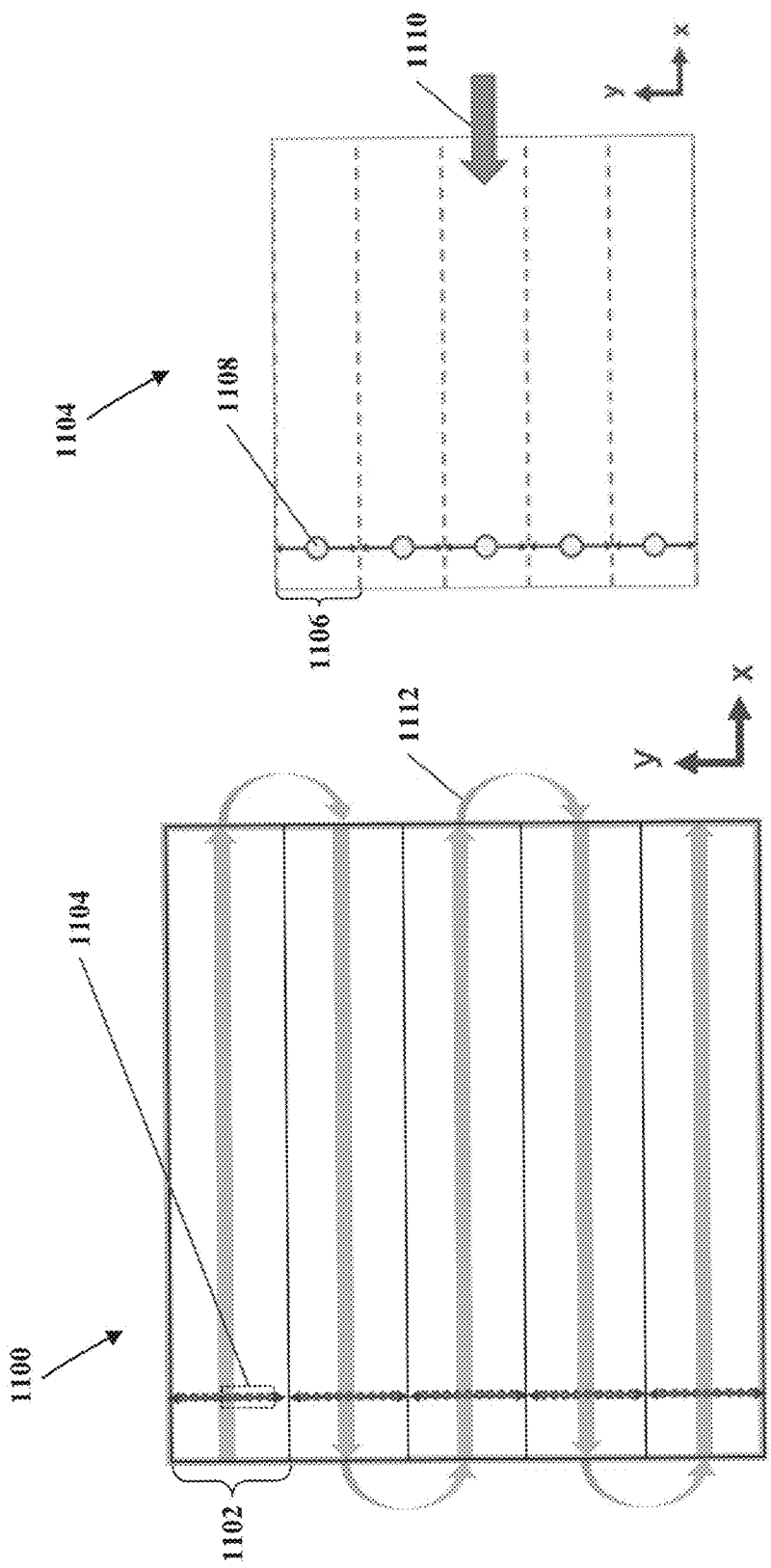

PATTERNED SUBSTRATE IMAGING USING MULTIPLE ELECTRON BEAMS

CROSS-REFERENCE TO RELATED APPLICATION(S)

This application claims benefit of U.S. Provisional Application No. 62/465,303, filed Mar. 1, 2017, the content of which is hereby incorporated by reference in its entirety.

TECHNICAL FIELD

This disclosure relates to the field of electron beam imaging in semiconductor manufacturing and, in particular, to multiple-electron-beam imaging for defect inspection.

BACKGROUND

The manufacture of integrated circuits (ICs) is a multi-step process carried out on a wafer or a mask, which can be generally referred to as a substrate. Multiple ICs are typically produced on each wafer and each IC can be inspected for defects. Defect inspection is one step of the manufacturing process of ICs. Inspection systems can detect defects that occur during the manufacturing process. Optical wafer/mask inspection systems have been conventionally used for wafer/mask inspection. High-resolution inspection systems also exist for substrate inspection.

SUMMARY

Disclosed herein are aspects, features, elements, and implementations of methods, apparatuses, and systems for multiple-electron-beam ("multi-beam") imaging.

In an aspect, a method for imaging a surface of a substrate using a multi-beam imaging system is disclosed. The method includes modifying an electron beam using a multipole-field device, generating beamlets from the electron beam using a beam-splitting device having multiple apertures, in response to projecting foci of the beamlets onto the surface, driving the beamlets using a deflector set to scan a region of the surface for receiving signals based on electrons scattered from the region, and determining an image of the region for inspection based on the signals.

In another aspect, a system for imaging a surface of a substrate using multiple electron beamlets is disclosed. The system includes an electron source, configured to generate an electron beam, a first multipole-field device for beam shaping and beam aberration correction, configured to modify a cross section of the electron beam from a first profile to a second profile, a beam-splitting device having multiple apertures, configured to generate and focus beamlets from the electron beam, a projection lens set, comprising at least one projection lens, configured to project foci of the beamlets onto a region of the surface, a deflector set, comprising at least one deflector, configured to drive the beamlets to scan the region, an objective lens set comprising at least one objective lens, configured to focus the beamlets into beam spots on the surface, a detector array, comprising at least one detector, configure to receive electrons scattered from the region to generate signals, a second multipole-field device comprising an electro-magnetic deflector, configure to deflect the electrons scattered from the region towards the detector set off a center axis of the beamlets, a processor, and a memory coupled to the processor, the memory configured to store instructions which when executed by the processor become operational with the processor to determine an image of the region for inspection based on the signals.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 3 is a diagram of an example beam spot with its shape modified by a multipole-field device according to implementations of this disclosure.

FIG. 4A is a diagram of a multi-aperture plate with a first example arrangement of apertures according to implementations of this disclosure.

FIG. 4B is a diagram of an example multi-aperture plate covered by different sizes of round beam spots according to implementations of this disclosure.

FIG. 4C is a diagram of an example multi-aperture plate covered by a round beam spot and an elliptical beam spot according to implementations of this disclosure.

FIG. 11A is a diagram of an example care area including divided strips for inspection according to implementations of this disclosure.

FIG. 11B is a diagram of a portion of an example strip of a care area according to implementations of this disclosure.

DETAILED DESCRIPTION

Figure 1:
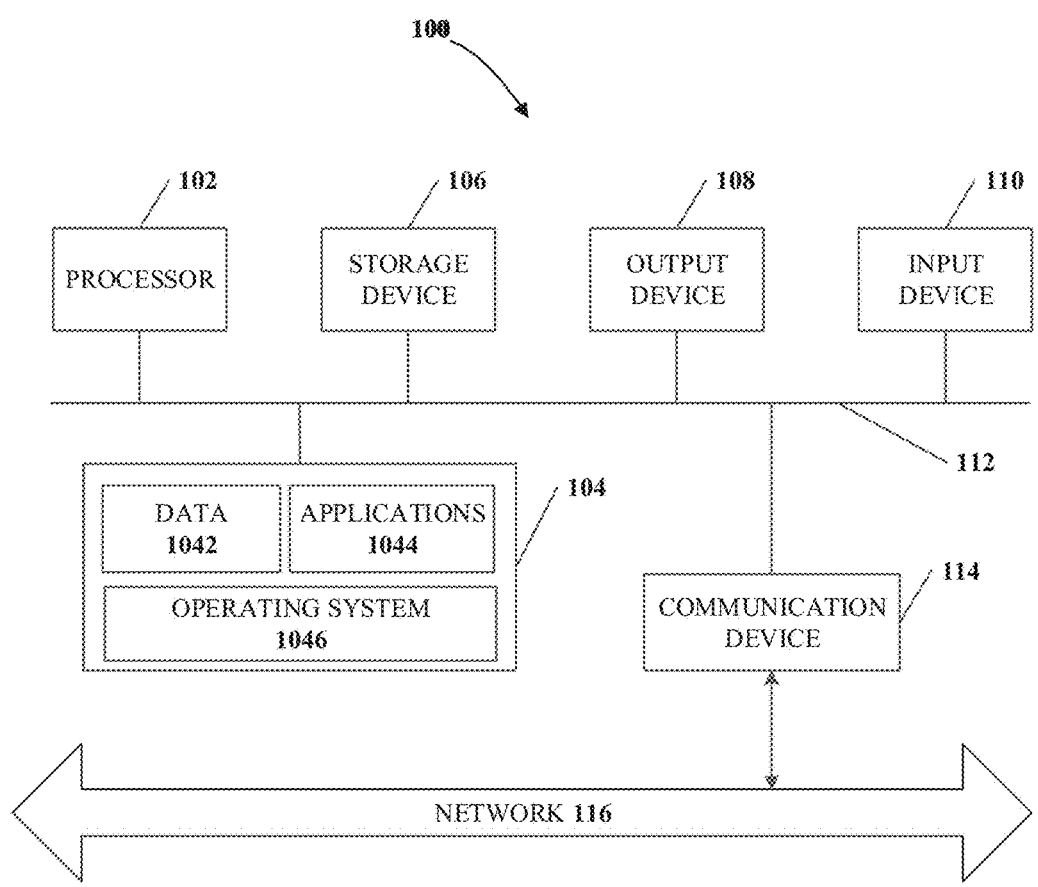
FIG. 1 is a block diagram of an example multi-beam imaging system according to implementations of this disclosure.

In semiconductor manufacturing, microchips, or integrated circuits (ICs) are fabricated on a wafer. The process of manufacturing ICs involves several phases, including a design phase, a manufacturing phase, and an inspection phase, for example. The design phase involves designing structures and arrangements of circuit elements for the ICs. The manufacturing phase can include multiple operations, such as, for example, lithography, etching, deposition, or chemical-mechanical planarization (CMP). In the manufacturing phase, during a "patterning" process, geometric feature (e.g., patterns) on a photomask (or "mask") or a reticle can be transferred to a surface of the wafer. The wafer with the transferred geometric features can be referred to as a "patterned wafer." In the inspection phase, the manufactured ICs can be inspected for quality control.

During the manufacturing phase, defects can occur. For example, the wafer surface can include defects, or the mask can include defects that can be transferred to the wafer. Therefore, it is advantageous to inspect the wafer and/or the mask (e.g., at proper processing operations) for potential defects in the inspection phase. The results of the inspection can be used to improve or adjust the design, the manufacturing, the inspection phases, or any combination thereof. Without loss of generality, a "patterned substrate" (or simply a "substrate" in a context without confusion) can be used herein to mean a wafer, a mask, a reticle, or any structure with patterns on it.

As the manufacture of ICs strives for smaller sized elements to achieve higher density for performances, detecting defects of small sizes becomes a challenge in semiconductor manufacturing. Imaging techniques are typically used to inspect defects on a patterned substrate. High throughput inspection systems (e.g., optical inspection systems) can face challenges of having insufficient sensitivity to find defects (e.g., physical defects) as design rules shrink (e.g., below 20 nm). In addition, optical inspection systems can have insufficient capability of detecting electrical defects buried below the surface. A high-resolution inspection system, such as an Electron Beam Inspection (EBI) system or a charged particle beam imaging system, becomes more important in defect inspection, especially for electrical defects and tiny physical defects. However, EBI systems have insufficient throughput, which limits its popularity in use for in-line process monitoring and high-volume manufacturing in a semiconductor process.

To increase the throughput of EBI systems, multiple-electron-beam (or hereafter referred to as "multi-beam") imaging techniques are used. A multi-beam imaging system uses multiple electron beams (referred to as "electron beamlets" or simply "beamlets") to inspect the patterned substrate. For example, the beamlets can be generated by splitting a single electron beam (referred to as "e-beam") using a splitting apparatus or apparatuses. The beamlets can be focused into spots on an object plane. The beamlets can also be transferred by projection of an intermediate lens (or intermediate lenses) toward an objective lens (or objective lenses). The objective lens can focus the beamlets. The focused beamlets can be used as a probe on a substrate surface. The beamlets can be deflected (e.g., being simultaneously deflected in the same direction) by a deflection apparatus for performing a raster scan (e.g., a two-dimensional raster scan) on the substrate surface. The raster scan on the substrate surface can excite secondary electron beamlets, which can be used to construct an image or images. In this disclosure, the scope or range within which the beamlets can perform an imaging process is referred to as a main field of view ("main-FOV"), and the scope or range within which a single beamlet of the beamlets can perform the imaging process is referred to as a sub-field of view ("sub-FOV").

In this disclosure, implementations of a multi-beam imaging system and scan methods for the multi-beam imaging system are described. The described multi-beam imaging system can be used for substrate (e.g., wafer or mask) inspection with a high throughput in semiconductor manufacturing. The described multi-beam imaging system can work in a continuous scan mode for inspection. The described multi-beam imaging system can also work in a step-and-scan mode for inspection. In the continuous scan mode, the multi-beam imaging system can increase the inspection throughput by reducing the settling time of the substrate stage. In some implementations, the continuous scan mode can increase the throughput of the multi-beam imaging system by two orders of magnitude compared to the step-and-scan mode. In some implementations, a linearly-arranged array of beamlets (referred to as "linear beamlets") can be used in the described multi-beam imaging systems to perform a line scan of the substrate in the continuous scan mode. The linear beamlets can be generated by splitting a modified single e-beam through a beam-splitting device. For example, the beam-splitting device can have multiple apertures or holes (referred to as a "multi-aperture device"). The multi-aperture device can include multiple apertures or holes to allow an electron beam to pass through. For example, the multi-aperture device can include multiple linearly-aligned apertures. The multi-beam imaging system and methods of performing inspection using the same will be detailed in the following description.

FIG. 1 is a block diagram of a multi-beam imaging system 100 in accordance with implementations of this disclosure. The system 100 can include an apparatus such as a computing device, which can be implemented by any configuration of one or more computers, such as a microcomputer, a mainframe computer, a supercomputer, a general-purpose computer, a special-purpose/dedicated computer, an integrated computer, a database computer, a remote server computer, a personal computer, or a computing service provided by a computing service provider, e.g., a web host, or a cloud service provider. In some implementations, the computing device can be implemented in the form of multiple groups of computers that are at different geographic locations and can communicate with one another, such as by a network. While certain operations can be shared by multiple computers, in some implementations, different computers can be assigned for different operations. In some implementations, the system 100 can be implemented using general-purpose computers/processors with a computer program that, when executed, carries out any of the respective methods, algorithms and/or instructions described herein. In addition, for example, special purpose computers/processors can be utilized which can contain specialized hardware for carrying out any of the methods, algorithms, or instructions described herein.

The system 100 can have an internal configuration of hardware including a processor 102 and a memory 104. The processor 102 can be any type of device capable of manipulating or processing information. In some implementations, the processor 102 can include a central processing unit (CPU). In some implementations, the processor 102 can include a graphics processor (e.g., a graphics processing unit or GPU). Although the examples herein are described with a single processor as shown, advantages in speed and efficiency can be achieved using multiple processors. For example, the processor 102 can be distributed across multiple machines or devices (in some cases, each machine or device can have multiple processors) that can be coupled directly or connected to a network. The memory 104 can be any transitory or non-transitory device capable of storing codes and data that can be accessed by the processor (e.g., via a bus). For example, the memory 104 can be accessed by the processor 102 via a bus 112. Although a single bus is shown in the system 100, multiple buses can be utilized. The memory 104 herein can be a random-access memory device (RAM), a read-only memory device (ROM), an optical/magnetic disc, a hard drive, a solid-state drive, a flash drive, a security digital (SD) card, a memory stick, a compact flash (CF) card, or any combination of any suitable type of storage devices. In some implementations, the memory 104 (e.g., a network-based or cloud-based memory) can be distributed across multiple machines or devices. The memory 104 can store data 1042, an operating system 1046, and an application 1044. The data 1042 can be any data for processing (e.g., computerized data files or database records). The application 1044 can include programs that permit the processor 102 to implement instructions to perform functions described in this disclosure.

In some implementations, in addition to the processor 102 and the memory 104, the system 100 can include a secondary (e.g., additional or external) storage device 106. The secondary storage device 106 can provide additional storage capacity for high processing needs. The secondary storage device 106 can be a storage device in the form of any suitable transitory or non-transitory computer-readable media, such as a memory card, a hard disc drive, a solid-state drive, a flash drive, or an optical drive. Further, the secondary storage device 106 can be a component of the system 100 or can be a shared device that can be accessed via a network. In some implementations, the application 1044 can be stored in whole or in part in the secondary storage device 106 and loaded into the memory 104. For example, the secondary storage device 106 can be used for a database.

In some implementations, in addition to the processor 102 and the memory 104, the system 100 can include an output device 108. The output device 108 can be, for example, a display coupled to the system 100 for displaying graphics data. If the output device 108 is a display, for example, it can be a liquid crystal display (LCD), a cathode-ray tube (CRT), or any other output device capable of providing a visible output to an individual. The output device 108 can also be any device transmitting visual, acoustic, or tactile signals to a user, such as a touch-sensitive device (e.g., a touchscreen), a speaker, an earphone, a light-emitting diode (LED) indicator, or a vibration motor. In some cases, an output device can also function as an input device—a touch screen display configured to receive touch-based input, for example.

In some implementations, the output device 108 can also function as a communication device for transmitting signals and/or data. For example, the output device 108 can include a wired mean for transmitting signals or data from the system 100 to another device. For another example, the output device 108 can include a wireless transmitter using a protocol compatible with a wireless receiver to transmit signals from the system 100 to another device.

In some implementations, in addition to the processor 102 and the memory 104, the system 100 can include an input device 110. The input device 110 can be, for example, a keyboard, a numerical keypad, a mouse, a trackball, a microphone, a touch-sensitive device (e.g., a touchscreen), a sensor, or a gesture-sensitive input device. Any type of input device not requiring user intervention is also possible. For example, the input device 110 can be a communication device such as a wireless receiver operating according to any wireless protocol for receiving signals. The input device 110 can output signals or data, indicative of the inputs, to the system 100, e.g., via the bus 112.

In some implementations, in addition to the processor 102 and the memory 104, the system 100 can optionally include a communication device 114 to communicate with another device. Optionally, the communication can be via a network 116. The network 116 can include one or more communications networks of any suitable type in any combination, including, but not limited to, Bluetooth networks, infrared connections, near-field connections (NFC), wireless networks, wired networks, local area networks (LAN), wide area networks (WAN), virtual private network (VPN), cellular data networks, or the Internet. The communication device 114 can be implemented in various ways, such as a transponder/transceiver device, a modem, a router, a gateway, a circuit, a chip, a wired network adapter, a wireless network adapter, a Bluetooth adapter, an infrared adapter, an NFC adapter, a cellular network chip, or any suitable type of device in any combination that can communicate with the network 116.

The system 100 can communicate with a wafer or reticle high-resolution inspection apparatus. For example, the system 100 can be coupled to one or more wafer or reticle inspection apparatus, such as an e-beam system or an optical system, which is configured to generate wafer or reticle inspection results.

The system 100 (and algorithms, methods, instructions etc. stored thereon and/or executed thereby) can be implemented as hardware modules, such as, for example, intellectual property (IP) cores, application-specific integrated circuits (ASICs), programmable logic arrays, optical processors, programmable logic controllers, microcode, firmware, microcontrollers, servers, microprocessors, digital signal processors, or any other suitable circuit. Further, portions of system 100 do not necessarily have to be implemented in the same manner.

According to implementations of this disclosure, an example multi-beam imaging system includes devices, components, or sub-systems for performing multi-beam imaging for a substrate on a stage. The multi-beam imaging system can include an electron optical system, a substrate stage, or relative control systems or units.

Figure 2:
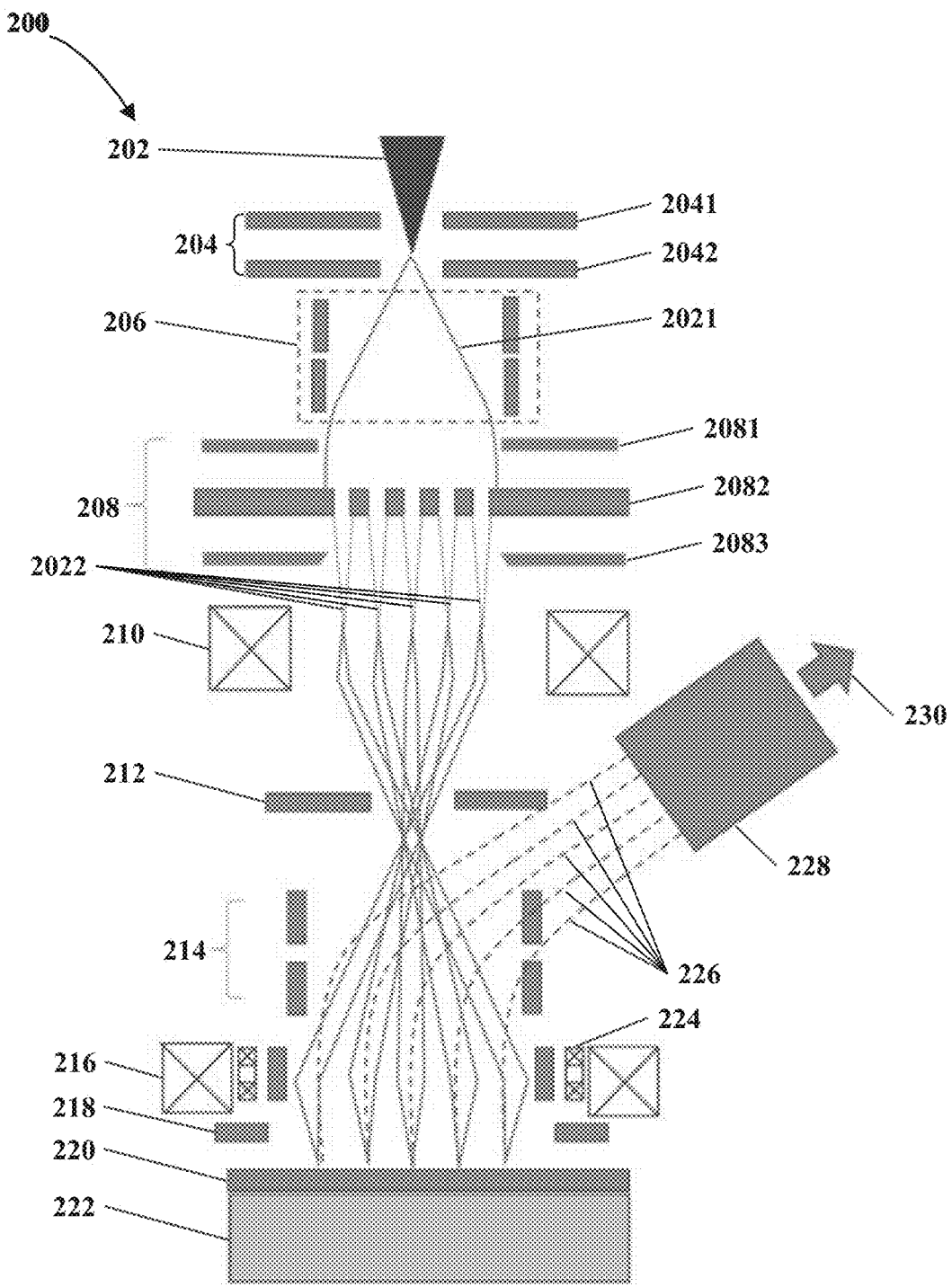
FIG. 2 is a diagram of an example multi-beam imaging system according to implementations of this disclosure.

FIG. 2 is a diagram of an example multi-beam imaging system 200 according to implementations of this disclosure. For example, the system 200 can be included in or connected to the system 100 of FIG. 1. The system 200 can also include the system 100 in FIG. 1. The components or sub-systems of the system 200 are described as follows.

An electron source 202 can be used to generate an electron beam ("primary beam"). For example, the electron beam can be a primary beam 2021 as shown in FIG. 2. The electron source 202 can be, for example, thermionic emitters, cold field emitters, or thermionic field emitters (e.g., Schottky-type emitters). The electron source 202 can include a single emitter or multiple emitters. In an implementation, the electron source 202 can be a thermionic field emitter, and electrons emitted by the field emitter can be extracted by an electrode set 204. The electrode set 204 can include one or more electrodes or plates applied with voltages. The extraction electrodes included in the electrode set 204 can have apertures for the emitted electrons to pass through. In an implementation, the electrode set 204 can include a suppressor electrode plate 2041 and an extractor electrode plate 2042. The suppressor electrode plate 2041 can be applied with a suppressing voltage for suppressing a portion of electrons (e.g., unwanted scattered electrons) emitted from the electron source 202 to form the primary beam 2021. The extractor electrode plate 2042 can be applied with an accelerating voltage for extracting the electrons in the primary beam 2021 and accelerate them to a certain velocity.

In some implementations, the electrode set 204 can also include electrostatic lenses (e.g., by using more electrodes) that can modify (e.g., collimate or focus) the primary beam 2021. In another implementation, the electrode set 204 can include a single anode plate with an aperture placed downstream the electron source 202. For example, the aperture of the single anode plate can have a diameter of 500 microns (μm).

Downstream the electron source 202 and the electrode set 204, a multipole-field device 206 is placed. In this disclosure, "downstream" refers to a direction along or with the direction of the electron beam emitting away from the electron source 202, and "upstream" refers to a direction against or opposite to the emitted electron beam. The multipole-field device 206 can include electric and/or magnetic devices that generate one or more multipole electric and/or magnetic fields to modify the shaper of the primary beam 2021. For example, through the multipole electric and/or magnetic field, the multipole-field device 206 can extend the primary beam 2021 along with a specific direction and suppress it in another direction (e.g., orthogonal or perpendicular to the specific direction).

In some implementations, the electric and/or magnetic devices can include four, six, eight, ten, twelve, or any number of poles. Each multipole electric and/or magnetic field device can be respectively "excited" with different voltages or currents for controlling a parameter referred to as "excitation strength." The excitation strength represents the ability to extend or suppress the cross-section of the e-beam (referred to as a "beam spot"). In this disclosure, "excitation" refers to a process of generating an electric or magnetic field using a voltage or an electric current, respectively. In multi-beam imaging systems using the step-and-scan mode, the beam spot of the primary beam 2021 is typically modified to a substantially round shape before being split into beamlets. Round primary beams (or substantially round primary beams) can be used for generating multiple beamlets in many multi-beam imaging systems.

For optimization of the multi-beam imaging system in the continuous scan mode, the beam spot of the primary beam 2021 can be modified to an elliptical shape. For example, as shown in FIG. 3, a shape 302 represents a profile of the beam spot of the primary beam 2021, and a shape 304 represents a profile of the beam spot of the primary beam 2021 after being modified. The multipole-field device 206 can be used to change the shape of the beam spot, such as, from a round primary beam (e.g., the shape 302) to an elliptical shape (e.g., the shape 304) by stretching and suppressing the primary beam to nearly confine it in one direction.

In an implementation, a round primary beam can be used to generate multiple beamlets. For example, a two-dimensional ("2D") multi-aperture device can be used to generate the multiple beamlets with the round primary beam. For another example, each aperture of the 2D multi-aperture device can be used to generate a beamlet of the generated beamlets. In another implementation, an elliptical primary beam can be used to generate multiple beamlets.

The multipole-field device 206 can be a single-stage (e.g., a single electric or magnetic multipole unit) or multi-stage device (e.g., a series of electric and/or magnetic multipole units). In an implementation, the multipole-field device 206 can be a two-stage device. The first stage can be used to extend the primary beam 2021 along one direction (referred to as "x-direction") while the second stage can be used to suppress the primary beam 2021 along with another direction orthogonal to the x-direction (referred to as "y-direction"). For example, the multipole-field device 206 can include an octupole electrostatic assembly and/or a quadrupole electrostatic assembly. The shape and size of the beam spot of the primary beam 2021 can also be controlled by adjusting the excitation strength, a relative distance between the multipole-field device 206 and a beam-splitting device 2082, or using a focusing device (not shown). For example, the electrode set 204 can function as the focusing device.

An electrostatic lens set 208 can be placed downstream the multipole-field device 206. The electrostatic lens set 208 can include the beam-splitting device 2082 and a set of single-aperture electrode plates. The beam-splitting device 2082 can be used to generate multiple beamlets 2022 by splitting the primary beam 2021 (e.g., after modification and correction) projected onto it.

In some implementations, the beam-splitting device 2082 can include one or more multi-aperture plates. The multi-aperture plates can have different implementations and/or parameters. In this disclosure, if an aperture of the multi-aperture plates does not have a straight-line profile, the smallest diameter or dimension of the aperture on a multi-aperture plate can be referred to as a "beam limiting size." For different multi-aperture plates, the configurations can be different for the beam limiting sizes of each aperture in a multi-aperture plate or pitches between each aperture of the multi-aperture plate.

In an implementation, the beam-splitting device 2082 can include multiple multi-aperture plates. The multi-aperture plates can be aligned with respect to apertures on them. For example, for a multi-aperture plate including an odd number of linearly-arranged apertures, the center aperture (e.g., the aperture in the middle of the linearly-arranged apertures) can be used as a reference position. For another example, for a multi-aperture plate including an even number of linearly-arranged apertures, the central axis (e.g., an axis penetrating through the center of the multi-aperture plate) of the multi-aperture plate can be used as a reference position. In addition to the center aperture or the central axial axis, other apertures in each of the multi-aperture plates can also be used as reference positions. When aligning the multi-aperture plates, a reference position can be selected for each multi-aperture plate, and the multi-aperture plates can be aligned with respect to the selected reference positions. Further, the multi-aperture plates can be aligned with each other in different orientations. For example, linearly-arranged apertures in each of the multi-aperture plates can be aligned in different orientations (e.g., x- and/or y-orientations). Also, the multiple multi-aperture plates can have different arrangements of the apertures (e.g., some multi-aperture plates with linearly-arranged apertures, some multi-aperture plates with non-linearly-arranged apertures).

In an implementation, the beam-splitting device 2082 can include switchable multi-aperture plates. For example, the switchable multi-aperture plates can include a first multi-aperture plate with 2D-arranged (e.g., non-linearly-arranged) apertures in a first region, a second multi-aperture plate with one-dimensional ("1D") arranged (e.g., linearly-arranged) apertures in a second region, and a third multi-aperture plate with a single aperture in a third region. Other arrangements and combinations of the multiple multi-aperture plates are also possible. By switching between the switchable multi-aperture plates, the multi-beam imaging system can work in different imaging modes. For example, the multi-beam imaging system can switch to work in the step-and-scan mode, the continuous scan mode, and the single-beam mode using the first multi-aperture plate, the second multi-aperture plate, and the third multi-aperture plate, respectively.

In an implementation, the beamlets generated (e.g., split) by a first multi-aperture plate can be converging, and a second multi-aperture plate downstream can be configured to have a pitch smaller than the pitch of the first multi-aperture plate. In another implementation, the beamlets generated by a first multi-aperture plate can be diverging, and a second multi-aperture plate downstream can be configured to have a pitch larger than the pitch of the first multi-aperture plate. In another implementation, the beamlets generated by a first multi-aperture plate can be parallel, and a second multi-aperture plate downstream can be configured to have a pitch the same with the pitch of the first multi-aperture plate.

Figure 4D:
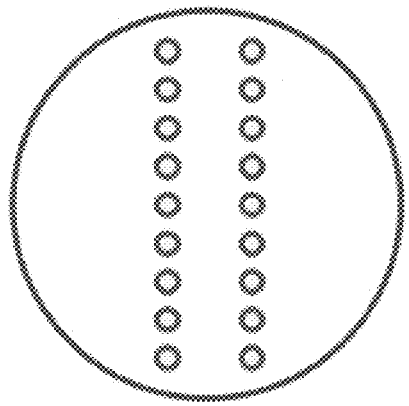
FIG. 4D is a diagram of a multi-aperture plate with a second example arrangement of apertures according to implementations of this disclosure.
Figure 4E:
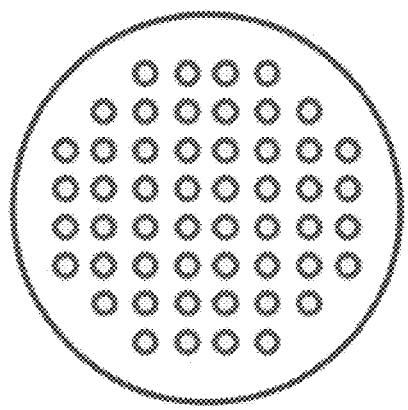
FIG. 4E is a diagram of a multi-aperture plate with a third example arrangement of apertures according to implementations of this disclosure.
Figure 4F:
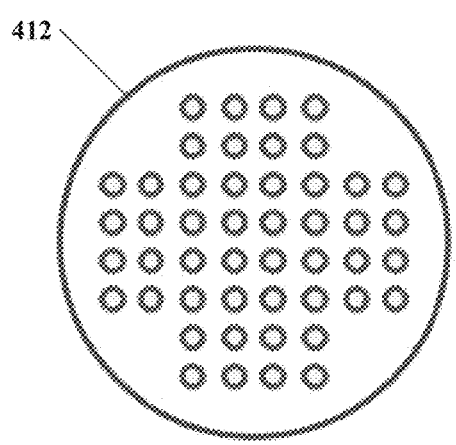
FIG. 4F is a diagram of a multi-aperture plate with a fourth example arrangement of apertures according to implementations of this disclosure.

In an implementation, the beam-splitting device 2082 can include at least one multi-aperture plate that further includes multiple apertures. For example, the multiple apertures in the multi-aperture plate can be linearly arranged along a straight line, as shown in FIG. 4A. For another example, the multiple apertures in the multi-aperture plate can be arranged along multiple parallel straight lines, as shown in FIG. 4D. For another example, the multiple apertures in the multi-aperture plate can be arranged in a first 2D array, as shown in FIG. 4E. For another example, the multiple apertures in the multi-aperture plate can be arranged in a second 2D array, as shown in FIG. 4F. The second 2D array in FIG. 4F shows a multi-aperture plate 412 with a 48-aperture array. The second 2D array in FIG. 4F can have other numbers or arrangements for the apertures. For example, the number of the apertures of the multi-aperture plate 412 can be $12 \cdot n^2$, in which n is a positive integer.

In FIG. 4F, the second 2D array of the apertures shows a cross-shaped profile or layout, which can be used to generate a 2D array of beamlets. The 2D array of beamlets can have a main-FOV covering a scanning section that can be joined (or "stitched") in a tile-fashion without causing duplicate or redundant scanning and/or stepping in the step-and-scan mode of the multi-beam imaging systems. The joining of the scanning sections covered by the 2D array of beamlets generated using the multi-aperture plate 412 will be shown and described in FIGS. 7A-7B.

In an implementation, for example, as shown in FIG. 4A, the multi-aperture plate 402 includes multiple linearly-arranged apertures 404. After passing through the multi-aperture plate 402, the primary beam 2021 can form an array of linearly-arranged multiple beamlets (e.g., the beamlets 2022). In an implementation, the beam-splitting device 2082 can be a multi-aperture plate with 12 linearly-arranged apertures, each having a diameter of 25 μm and a spacing of 25 μm in between. Other numbers and dimensions of the apertures on the beam-splitting device 2082 are possible. The number of beamlets can be controlled using a focus device (e.g., an electrostatic immersion lens), which can variate the size of the beam spot of the primary beam 2021. For example, the electrostatic immersion lens can be placed downstream or upstream the suppressor electrode plate 2041.

In an implementation, the multipole-field device 206 can also be used as an aberration corrector to correct aberrations of a round primary beam before generating the beamlets. The extent or level of the aberration correction applied by the multipole-field device 206 can be controlled. For example, the multipole-field device 206 can be controlled to minimize the aberrations. For another example, the multipole-field device 206 can be controlled to maintain a certain extent of aberrations, and downstream devices (e.g., the beam-splitting device 2082) can be used/controlled to further correct the remaining aberrations (e.g., by producing counter-aberrations with an opposite sign or in an opposite direction of the remaining aberrations) to obtain substantially complete cancellation of the aberrations.

In an implementation, the beam spot of the primary beam 2021 can be modified by the multipole-field device 206 to have an approximately round profile or shape. Generally, different numbers of beamlets can be generated by control the size of the beam spot. For example, as shown in FIG. 4B, the apertures 404 on the multi-aperture plate 402 can be covered by a round beam spot of the primary beam 2021. The round beam spot can be controlled to have different sizes, such as a first round beam spot 406 with a larger size and a second round beam spot 408 with a smaller size. In FIG. 4B, the first round beam spot 406 can generate more beamlets than the second round beam spot 408. The size of the beam spots can be adjustable. Though the apertures 404 is shown as linearly arranged, they can be arranged in any form. For example, the apertures 404 can be arranged as shown in FIGS. 4D-4F.

In another implementation, the beam spot of the primary beam 2021 can be modified by the multipole-field device 206 to have an elliptical profile. The elliptical-profile primary beam can be used to optimize performances of the continuous scan mode for the multi-beam imaging system. For example, as shown in FIG. 4C, the apertures 404 on the multi-aperture plate 402 can be covered by an elliptical beam spot 410 of the primary beam 2021. The second round beam spot 408 is also shown in FIG. 4C for comparison. In an implementation, the elliptical beam spot 410 can be adjusted to a size that is just large enough to cover the apertures 404 on the multi-aperture plate 402.

In some implementations, by modifying the primary beam 2021 into an elliptical shape, the multi-aperture plate 402 with linearly-arranged apertures can generate beamlets with higher beam density, which can further cause more effective use of beams. In another implementation, the primary beam 2021 can be modified into other shapes in addition to an elliptical shape.

In some multi-beam imaging systems, the multiple apertures on the multi-aperture plate are arranged in two dimensions. For example, the multiple apertures can be arranged as a 2D array symmetric to the center axis of the primary beam 2021. Designs of the 2D arrays can include but are not limited to a square arrangement, a hexagon arrangement, or a circular arrangement. With such multi-aperture plate configuration, a 2D beamlet array can be generated. In this disclosure, as an example, the multi-aperture plate (e.g., the multi-aperture plate 402) is designed with linearly-arranged apertures (e.g., the apertures 404). The linearly-arranged apertures on the plate can form an aperture array along a single line or multiple parallel lines. The longer side of the aperture array can also be aligned with the long axis of the ellipse beam spot (e.g., the elliptical beam spot 410), thus all the linearly-arranged apertures can be covered by the elliptical beam spot projected on the multi-aperture plate. With such multi-aperture plate configuration, a 1D beamlet array can be generated. For example, the 1D beamlet array can be used for a line scan in the continuous scan mode of the multi-beam imaging system. The area of the substrate surface covered by one line scan is referred to as a "line" herein.

To optimize imaging properties of the beamlets 2022, electrostatic lenses or similar devices can be used to control the primary beam 2021 and/or the beamlets 2022. For example, the electrostatic lens set 208 can include a first single-aperture electrode plate 2081 placed upstream the beam-splitting device 2082 and a second single-aperture electrode plate 2083 placed downstream the beam-splitting device 2082. The first single-aperture electrode plate 2081 and second single-aperture electrode plate 2083 can be centered at a center axis of the primary beam 2021. In an implementation, the apertures of the first single-aperture electrode plate 2081 and the second single-aperture electrode plate 2083 can be larger than 600 μm. Other dimensions of the apertures on the single-aperture electrode plates 2081 and 2083 are possible. The first single-aperture electrode plate 2081 and the second single-aperture electrode plate 2083 can be used to generate a local electric field that determines an incident angle of the primary beam 2021. Each of the generated beamlets 2022 can be further modified by the local electric field generated by the single-aperture electrode plates 2081 and 2083 by, for example, being converged, diverged, collimated, focused, and/or defocused.

In an implementation, with the beam-splitting device 2082, the first single-aperture electrode plate 2081 and the second single-aperture electrode plate 2083 are applied with different voltages to form an electrostatic lens. For example, the electrostatic lens can be used for collimating the beamlets 2022 and focusing each beamlet thereof. For better performance, the primary beam 2021 can be collimated before passing through the beam-splitting device 2082. For another example, the incident angle of the primary beam 2021 can be adjusted by changing the voltages applied on the first single-aperture electrode plate 2081 and the second single-aperture electrode plate 2083. For optimization, the incident angle can be adjusted to determine the brightness and reduce aberration for the beamlets 2022.

In the above implementation, the voltages of the first single-aperture electrode plate 2081, the second single-aperture electrode plate 2083, and the beam-splitting device 2082 can be set so that each beamlet of the beamlets 2022 can be individually focused on a plane downstream the electrostatic lens set 208. The profile of each beamlet can be determined by the local electric field between the first single-aperture electrode plate 2081, the second single-aperture electrode plate 2083, and the beam-splitting device 2082. To optimize the imaging condition of multi-beam EBI, the beamlets 2022 can also be slightly converged or collimated. For example, in an implementation, with an anode plate (e.g., the extractor electrode plate 2042 or a single anode plate in the electrode set 204) placed upstream the beam-splitting device 2082, voltages G, $V_0$, $V_1$, and $V_2$, with G<$V_1$<$V_0$<$V_2$, can be applied to the anode plate, the beam-splitting device 2082, the first single-aperture electrode plate 4081, and the second single-aperture electrode plate 2083, respectively. The values of those voltages are determined so that the primary beam 2021 can be collimated before passing through the beam-splitting device 2082 and each beamlet can focus individually while remaining parallel to each other as much as possible. The voltages G, $V_0$, $V_1$, and $V_2$ can be varied to other values. The size of the beam spot of the primary beam 2021 on the beam-splitting device 2082 can also be adjusted by tuning the aforementioned voltages. In an implementation, the beam-splitting device 2082 can be configured as multi-aperture lenses by biasing the beam-splitting device to a voltage in a range from −20 kV to 20 kV.

Due to a variety of factors (e.g., locations of the beamlets 2022, deformation of the beam spot, and/or non-uniformity of electric fields), beamlets 2022 downstream the electrostatic lens set 208 can have aberrations. Aberrations existing in a multi-beam imaging system can include spherical aberration, chromatic aberration, astigmatism, and field curvatures. Spherical aberration and chromatic aberration occur mainly due to the non-uniformity of on- or off-axis focus conditions (e.g., local electric or magnetic fields of electrostatic lenses) for the electron beams. Astigmatism and field curvatures occur mainly due to the anisotropic asymmetry of the on- or off-axis focus conditions and off-axis electron beams. For example, one of the causes for the anisotropic asymmetry and the off-axis electron beams can be the elliptical deformation of the primary beam 2021 modified by the multipole-field device 206. The aberration can lead to degradation in imaging resolution of the multi-beam imaging systems.

In some implementations, an optional aberration corrector set including one or more aberration correctors (not shown) can be used in the system 200 to eliminate or reduce the aberration of the beamlets 2022. The optional aberration correctors can be placed upstream or downstream a focusing plane of the beamlets 2022. In some implementations, the system 200 can include a spherical aberration corrector, an astigmatism corrector, and/or a field curvature corrector.

In an implementation, the spherical aberration corrector can be one or more multipole-field devices upstream or downstream the focusing plane of the beamlets 2022. For example, the multipole-field device 206 can function as the spherical aberration corrector. For another example, the spherical aberration corrector can be a multiple (e.g., quadrupole or octupole) magnetic field device upstream the multi-aperture plate.

In an implementation, astigmatism and the field curvatures can be reduced via a specially designed multi-aperture plate. For example, the multi-aperture plate included in the beam-splitting device 2082 can function as the specially designed multi-aperture plate.

Figure 5A:
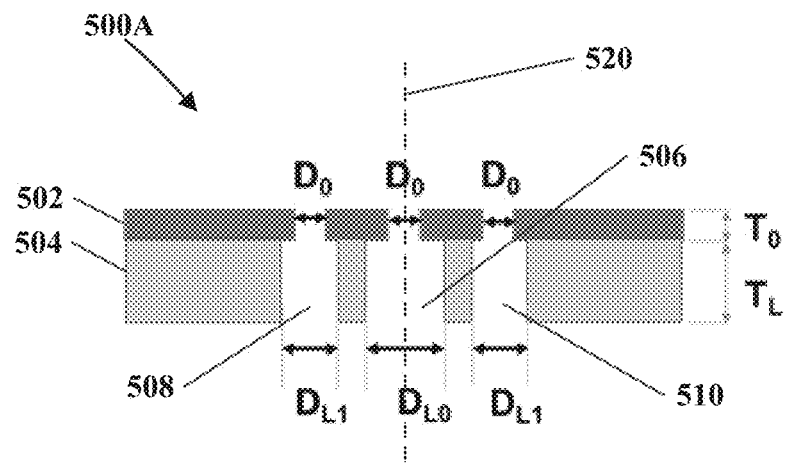
FIG. 5A is a cross-sectional diagram of an example multi-aperture plate according to implementations of this disclosure.

In an implementation, the beam-splitting device 2082 can include a two-layer multi-aperture plate 500A as shown in a cross-sectional diagram FIG. 5A. The multi-aperture plate 500A can include a first layer 502 facing the primary beam 2021 (upstream) with a thickness $T_0$ and a second layer 504 downstream the first layer 502 with a thickness $T_L$. The multi-aperture plate 500A can be fabricated with micromachining techniques. The first layer 502 can include apertures with a uniform size $D_0$ to split the primary beam 2021. $D_0$ can function as the beam limiting size that is used to limit the current of each outgoing beamlet. The second layer 504 can include apertures with different sizes, correspondingly aligned with the apertures of the first layer 502. A size of an aperture in the second layer 504 decreases as its distance to a center axis 520 of the multi-aperture plate 500A increases. For example, in FIG. 5A, an aperture 506 with a size $D_{L0}$ has a first distance to the center axis 520 (e.g., zero distance—i.e., the aperture 506 is centered at the center axis 520) of the multi-aperture plate 500A. An aperture 508 with a size $D_{L1}$ and an aperture 510 with the size $D_{L1}$ have a second distance to the center axis 520 of the multi-aperture plate 500A. The first distance is smaller than the second distance, and $D_{L0}$ is greater than $D_{L1}$. To keep off scattered electrons, the apertures of the second layer 504 all have larger sizes than the corresponding apertures of the first layer 502. For example, as shown in FIG. 5A, it is $D_{L0} > D_0$ and $D_{L1} > D_0$. With such configuration, beamlets outgoing from different apertures (e.g., the apertures 506, 508, and 510) can have different foci and thus can focus on the same plane with reduced aberration (e.g., reduced astigmatism and field curvatures).

Figure 5B:
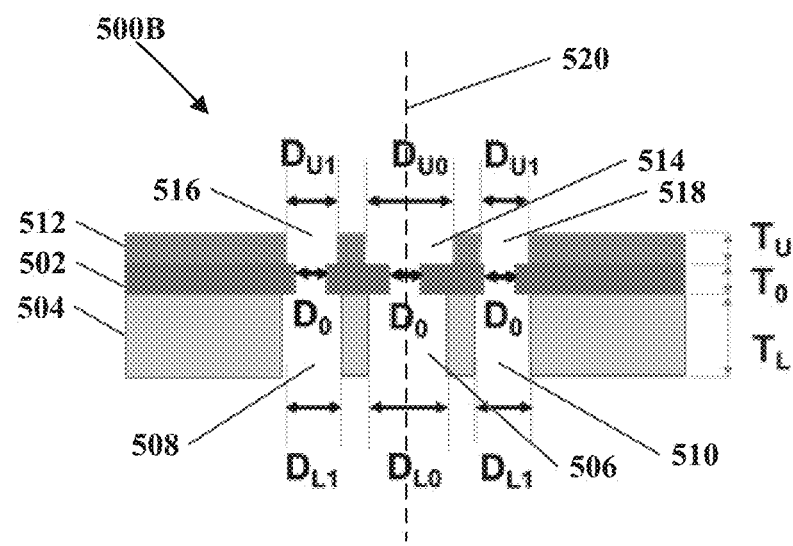
FIG. 5B is a cross-sectional diagram of another example multi-aperture plate according to implementations of this disclosure.

In another implementation, as shown in FIG. 5B, in addition to the first layer 502 and the second layer 504 in FIG. 5A, the multi-aperture plate 500B can further include a third layer 512 upstream the first layer 502 with a thickness $T_U$. For example, the multi-aperture plate 500B can be placed upstream the focusing plane of the beamlets, using the third layer 512 to converge the beamlets incident to the first layer 502. The third layer 512 can include apertures with different sizes, aligned with the corresponding apertures of the first layer 502. Similar to the second layer 504, a size of an aperture in the third layer 512 decreases as its distance to the center axis 520 of the multi-aperture plate 500B increases. For example, in FIG. 5B, an aperture 514 with a size $D_{U0}$ has a third distance to the center axis 520 (e.g., zero distance—i.e., the aperture 514 is centered at the center axis 520) of the multi-aperture plate 500B. An aperture 516 with a size $D_{U1}$ and an aperture 518 with the size $D_{U1}$ have a fourth distance to the center axis 520 of the multi-aperture plate 500B. The third distance is smaller than the fourth distance and $D_{U0}$ is greater than $D_{U1}$. In some implementations, the third and fourth distances can be equal to the first and second distances, respectively. To converge the beamlets incident to the first layer 502, the apertures of the third layer 512 all have sizes larger than the corresponding apertures of the first layer 502 and smaller than the corresponding apertures of the second layer 504. For example, as shown in FIG. 5B, the apertures 514, 516, and 518 can correspond to the apertures 506, 508, and 510, respectively, with $D_{L0} > D_{U0} > D_0$ and $D_{L1} > D_{U1} > D_0$.

Referring back to FIG. 2, downstream the electrostatic lens set 208, a projection lens set (or referred to as "intermediate lens set") 210 can be used to project (e.g., converge or concentrate) the beamlets 2022. The projection lens set 210 can include one or more electric/magnetic projection lenses. In an implementation, the projection lens set 210 can include a magnetic condenser lens. Together with an objective lens set 216, the projection lens set can magnify or minify the profile of the beamlets 2022 projected onto a surface of a substrate 220 under inspection. For example, excitation strengths of the projection lens set 210 (e.g., the magnetic condenser lens) and the objective lens set 216 can be determined so that a spacing between each beamlet of the beamlets 2022 is around 25 μm on the surface of the substrate 220, and the sub-FOV of each beamlet is larger than the spacing of 25 μm. The spacing between beamlets 2022 on the surface of the substrate 220 and the sub-FOV of each beamlet can be adjustable.

In an implementation, an optional aperture plate 212 can be placed downstream the projection lens set 210 to block scattered electrons. Downstream the projection lens set 210, a deflector set 214 can be used to drive the beamlets 2022 to scan at least a portion (e.g., a section/strip of a care area) of the substrate 220. A "care area" is an area on a wafer that is to be inspected. The deflector set 214 can include one or more scanning deflectors. The scanning direction of each scanning deflector can be adjustable. For example, the scanning directions can be perpendicular or skew-intersected. In an implementation, the deflector set 214 can be concentrically placed in the center of the objective lens set 216.

The objective lens set 216 can focus the beamlets 2022 on the surface of the substrate 220. In an implementation, the objective lens set 216 can include a magnetic condenser lens. For example, the objective lens set 216 can focus the beamlets 2022 onto a section/strip of the care area, each beamlet having a sub-FOV covering a sub-section of the section/strip. In an implementation, the objective lens set 216 can be an immersive objective lens with a booster 218 to converge the beamlets 2022 in shorter foci. Using the immersive objective lens, the beamlets 2022 can "immerse" in an electromagnetic field generated by the booster 218 and the substrate 220. For example, the electromagnetic field can be generated by applying a voltage on the substrate 220 and the booster 218, and the voltage of the booster 218 can be set higher than the voltage of the immersive objective lens.

A substrate stage 222 can be used to carry the substrate 220. The substrate stage 222 is controllable to move to expose different portions of the substrate 220 under the beamlets 2022 for inspection. As aforementioned, there can be two types of motion control modes for the substrate stage 222 corresponding to two image scan methods: the step-and-scan mode and the continuous scan mode. In the continuous scan mode, the substrate stage 222 can keep moving in a first direction (e.g., a horizontal direction or "x-direction") at a constant speed while the linearly-arranged beamlets can perform a line scan in a second direction (e.g., a vertical direction or "y-direction"). For example, the second direction can be approximately orthogonal to the first direction.

When the beamlets 2022 hit the surface of the substrate 220, the electrons can be scattered, such as in a direction against the incident beamlets 2022. Generally, the scattered electrons can be categorized into two groups: backscattering electrons (BSEs) scattered due to elastic collisions and secondary electrons (SEs) scattered due to inelastic collisions (e.g., ionization). The BSEs and SEs generated from the beamlets can form BSE beamlets and SE beamlets, respectively. In this disclosure, the BSE beamlets and SE beamlets can be collectively referred to as "scatter beamlets."

A Wien filter set 224 including at least one Wien filter can be used to deflect or bend the scatter beamlets 226 away from a center axis of the incident beamlets 2022, while keeping the incident beamlets 2022 not bent. The scatter beamlets 226 can be directed toward an off-axis (e.g., away from the center axis of the primary beam 2021) detector 228 to be captured. In some implementations, the detector 228 can be a detector array including multiple detectors. An excitation strength of the Wien filter set 224 can be determined so that the scatter beamlets 226 can reach the surface of the detector 228. In an implementation, the Wien filter set 224 can be concentrically placed in the center of the objective lens set 216.

In an implementation, the Wien filter set 224 can be replaced by other types of multipole-field devices, such as, for example, E×B deflectors, in which E represents an electric field and B represents a magnetic field.

Corresponding to different detector setups, there can be at least two ways of providing Wien filter applications. A first application is to slightly deflect the scatter beamlets 226 via a weak excitation strength of the Wien filter set 224 (e.g., by setting a weak electric and/or magnetic field of the Wien filter set 224) and to place the detector 228 adjacent to the center axis of the beamlets 2022. A second application is to deflect the scatter beamlets 226 by a large angle via a strong excitation strength of the Wien filter set 224 (e.g., by setting a strong electric and/or magnetic field of the Wien filter set 224) and to place the detector 228 far from the center axis of the beamlets 2022. The first application can save space and reduce the total size of the system 200. The second application can reduce interactions between the incident beamlets 2022 and the scatter beamlets 226, and there can be more space for an optional projection system for the scatter beamlets (not shown). In an implementation, the first application is used in the system 200. In another implementation, the second application is used in the system 200.

In an implementation, the objective lens set 210 can include at least one electrode for controlling an electric field on the surface of the substrate 220. For example, a high voltage can be applied to provide an electric field (referred to as a "surface extraction field") to extract scattered electrons (e.g., BSEs or SEs) effectively to form the scatter beamlets 226. For another example, the substrate 220 can be biased at a negative voltage with respect to grounded magnetic lens polepiece to provide the surface extraction field. For another example, a field strength of the surface extraction field can range from 400 V/mm to 6000 V/mm.

The detector 228 can be used to capture the scatter beamlets 226 and generate signals 230. The signals 230 can be analog and/or digital signals, and can be further processed by an image processing system (not shown). The image processing system can receive and process the signals 230 to generate one or more images of the scanned substrate surface for inspection. In an implementation, the image processing system can generate and process images with high speed (e.g., with an image capture rate greater than or equal to 400 MHz). For example, the image processing system can process the images using parallel computing. For another example, the image processing system can use CPUs and/or GPUs in the system 100 (e.g., the processor 102) and a memory (e.g., the memory 104) for processing. The image capture rate can be adjusted. When the system 200 works in the continuous scan mode, depending on data processing methods used by the image processing system, the generated images of all strips can be mosaicked for inspection, or the image of each strip can be pre-processed.

The detector 228 can be of various types, including but not limited to a microchannel plate (MCP), a silicon diode detector (SDD), an Everhart-Thornley (ET) detector, or a charge-coupled device (CCD) detector. In an implementation, the detector 228 can be a detector array that includes multiple detector units or regions, and each detector unit can detect a single scatter beamlet. For example, the detector units of the detector array can match the arrangement of the scatter beamlets 226 so that each scatter beamlet can be captured by one detector unit. In an implementation, a 12-aperture plate is used as the beam-splitting device 2082, and, correspondingly, an SDD detector with 12 strip-shape detecting regions can be used. The SSD detector can be placed off-axis above the objective lens for the system 200 working in the continuous scan mode. The shape and dimension of the detector units can be varied as long as there is no crosstalk between the scatter beamlets 226 and each scatter beamlet can be detected.

In some implementations, optionally, there can be a projection system (not shown) upstream the detector 228 for optimizing imaging conditions on the detector surface. For example, the projection system can scale and project the scatter beamlets 226 to respective detector units (e.g., separate units or isolated units) of the detector 228. The projection system can also eliminate or reduce aberration, deflection/displacement errors, and/or rotation errors of the scatter beamlets 226. For example, the projection system can include a projection lens, a deflector, and/or a rotation corrector.

For moveable components of the system 200, electronic control systems (not shown) can be used to drive and control them to function. For example, the electronic control systems can control at least one of the projection lens set 210, the optional aperture plate 212, the deflector set 214, the objective lens set 216, the booster 218, the substrate stage 222, the Wien filter set 224, and/or the optional projection system (not shown) upstream the detector 228. Based on the motion modes of the substrate stage 222, parameters of the electronic control systems and other components of the system 200 can be adjusted for optimizing imaging conditions and the total throughput. For example, in the step-and-scan mode, 2D beam array is used, and the parameters of the electronic control system can be adjusted to optimize performance. The control strategies can also be adjusted to coordinate with the step-and-scan method. For another example, in the continuous scan mode, 1D beam array is used, and different designs and control strategies can be used corresponding to the 1D beamlet configuration. The parameters of the electronic control system for the continuous scan mode can be different from the parameters for the step-and-scan mode. For another example, in the continuous scan mode, the moving speed of the substrate stage 222 can be set to match the image capture rate of the image processing system (not shown) so that all pixels of the care area can be scanned. For example, the moving speed can be determined or optimized using a learning technique (e.g., a machine learning technique and/or a statistics-based learning technique). For another example, the moving speed can be adaptively determined for varying types of substrates, inspection conditions, defects, and/or aberrations. In an implementation, the electronic control system can deflect the beamlets 2022 for scanning with high speed (e.g., with a scanning rate greater than or equal to 400 MHz). The scanning rate can be adjustable.

It is understood that components or sub-systems of the system 200 as described herein is not limited to the aforementioned implementations or examples. More parts or components with various designs and/or functions can be added to the system 200 for function extensions or performance optimization.

For example, in an implementation, the system 200 can include an electron source, at least one multipole-field device, at least one multi-aperture plate, at least one single-aperture electrode plate, at least one optional aberration corrector, at least one projection lens, an objective lens, at least one deflector, at least one Wien filter, a substrate stage, a detector or detector array, an image processing system, and at least one electronic control system.

For another example, in another implementation, the system 200 can include a single electron emitter as an electron source, a set of an octupole/quadrupole electrostatic assembly as a multipole-field device, a 12-aperture plate as a multi-aperture plate, two single-aperture electrode plates, a magnetic condenser lens as a projection lens, two electrostatic deflectors, a quadrupole Wien filter, an immersive objective lens with a booster, a substrate stage, a strip-arrayed SDD detector, a scattered-electron (e.g., BSEs or SEs) projection system, an image processing system, and control systems of moveable modules/components.

For another example, in another implementation, the system 200 can include: an electron source for generating a primary electron beam, a multipole-field device for shaping the primary electron beam, an electron lens for collimating the primary electron beam before entering a splitting device, at least one multi-aperture plate for splitting the primary electron beam into multiple beamlets and bringing each beamlet into focus on a plane in a downstream region, an electron lens for manipulating the foci of the multiple beamlets on an image plane after the splitting, a projection lens for projecting the foci of the multiple beamlets to the substrate, an objective lens for focusing the multiple beamlets into fine spots on the surface of the substrate, a deflector set comprising at least one deflector for scanning all of the multiple beamlets for exciting scattered electrons (e.g., BSEs or SEs), a stage for holding the substrate and for moving in a specific mode to position the substrate for primary beamlets scanning, a multipole-field device for deflecting scatter beamlets off-axis, a scattered-electron (e.g., BSEs or SEs) optics system for projecting and guiding the scatter beamlets towards an array of detectors, the array of detectors coupled to a signal process circuit for converting the scatter beamlets into electron signals, a processor for constructing, storing, or distributing images obtained from the array of detectors based on the electron signals, and a computer system for processing the images for a predefined application.

In some implementations, both the step-and-scan mode and the continuous scan mode are available and switchable for the system 200. For performance optimization, various scan parameters (e.g., the image capture rate, the scanning rate, the beamlet shape and sizes, overlapping of neighboring FOVs of beamlets, or any other operational parameters of the multi-beam imaging system) can be applied for the step-and-scan mode and the continuous scan mode, respectively.

In some implementations, a multi-beam imaging system (e.g., the system 200) can also work in a single-beam imaging mode in addition to the multi-beam imaging mode. For example, a multi-aperture plate of the multi-beam imaging system can switch between a multi-beam mode and a single-beam mode. In an implementation, the multi-aperture plate of the multi-beam imaging system can be movable using a moving mechanism (e.g., rotating).

Figure 6:
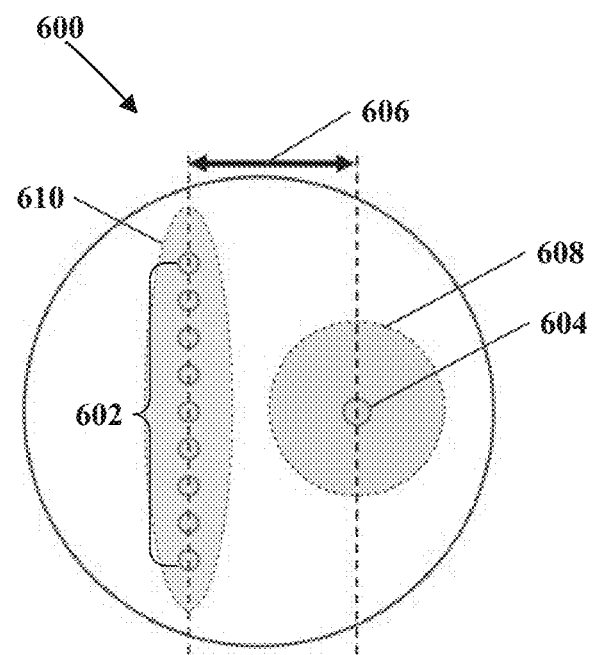
FIG. 6 is a diagram of an example multi-aperture plate capable of switching between a multi-beam mode and a single-beam mode according to implementations of this disclosure.

As shown in FIG. 6, a multi-aperture plate 600 can include multiple apertures 602 in a first region and a single aperture 604 in a second region. For example, the multiple apertures 602 and the single aperture 604 can have a distance 606 to each other. The multi-aperture plate 600 can switch the first and second region to be under a beam spot of the primary beam. The multiple apertures 602 are under the beam spot when the multi-aperture plate 600 is at a first position, while the single aperture 604 is under the beam spot when the multi-aperture plate 600 is at a second position. For example, the switching of the first and second positions can be done by rotating the multi-aperture plate 600. When in the single-beam mode, a round beam spot 608 can be used, and the operational parameters of components of the multi-beam imaging system can be adjusted so that imaging conditions for the single-beam mode can be optimized. When in the multi-beam mode, an elliptical beam spot 610 (e.g., modified by the multipole-field device 206) can be used, and the operational parameters of components of the multi-beam imaging system can be adjusted so that imaging conditions for the multi-beam mode can be optimized.

In an implementation, there can be more than one single aperture on the multi-aperture plate 600. For example, there can be two or more single apertures with different diameters on the multi-aperture plate 600. In another implementation, the multi-aperture plate of the multi-beam imaging system can be replaceable. For example, the multi-aperture plate 402 can be replaced with the multi-aperture plate 600.

In this disclosure, scan methods for the aforementioned implementations of the multi-beam imaging system are also included. Detailed descriptions of the methods are provided as follows.

In some multi-beam imaging systems, the images of a given region of interest (ROI) or a care area can be captured in FOVs of the beamlets. For example, the images of the given region of ROI can be captured by scanning (e.g., raster scanning) a main-FOV of the beamlets. In an implementation, during the scanning of a FOV, a substrate stage (e.g., the substrate stage 222 in FIG. 2) can be kept stationary at a first position, and at least one deflection unit (e.g., the deflector set 214 in FIG. 2) can deflect the beamlets to scan a substrate (e.g., the substrate 220 in FIG. 2) placed on the substrate stage. For example, the deflection unit can be excited and/or driven by raster-scan signals. In an implementation, all beamlets (e.g., all beamlets of the beamlets 2022 in FIG. 2) can scan (e.g., simultaneously scan) the substrate and a main-FOV image can be generated. The main-FOV image can include multiple sub-FOV images, each of the sub-FOV images formed by a beamlet of the beamlets. When the scanning of the main-FOV is completed, the substrate stage can move to a second position for a next scan (referred to as "stepping"). The stepping and scanning can be repeated until all care areas on the substrate are scanned and the inspection process is completed. This mode of inspection is generally referred to as a step-and-scan (or "step-and-repeat") mode. In some implementations, multiple beamlets can be used to inspect the substrate in the step-and-scan mode.

Figure 7A:
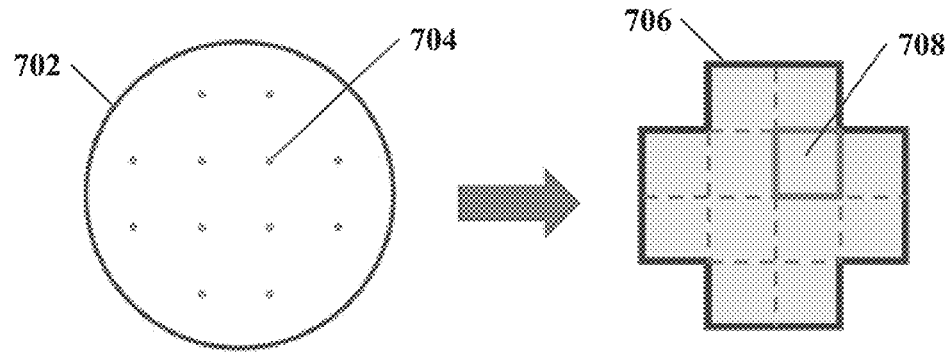
FIG. 7A is a diagram of an example multi-aperture plate and a field of view (FOV) of corresponding beamlets according to implementations of this disclosure.

In some implementations, 2D beamlets can be used to inspect the substrate in the step-and-scan mode. For example, as shown in FIG. 7A, a multi-aperture plate 702 can include a 2D aperture array in a matrix arrangement. The 2D aperture array includes multiple apertures, including an aperture 704. Multiple 2D beamlets (e.g., in the matrix arrangement) can be generated using the multi-aperture plate 702. The 2D beamlets can have a main-FOV 706 on a substrate surface, which includes multiple sub-FOVs including a sub-FOV 708. The sub-FOVs can correspond to respective individual beamlets of the 2D beamlets. For example, the sub-FOV 708 can correspond to an individual beamlet generated by the aperture 704. In some implementations, the sub-FOV 708 and its generated image can be square or rectangular. An actual size of the sub-FOV 708 on the substrate surface can be slightly overlapped, connected (or "stitched") with, or separated from its neighboring sub-FOVs. In an implementation, the sub-FOV 708 can be square, and its physical size can be controlled so that all sub-FOVs of the main-FOV 706 on the substrate surface can be stitched with a neighboring sub-FOV, in which the main-FOV 706 can cover an actual size expected to be equal to a sum of its all sub-FOVs.

In some implementations, a care area of a patterned substrate can be a rectangular or square shape. In the step-and-scan mode, a main-FOV of the 2D beamlets can cover a first portion of the care area for scanning, and the substrate stage can step or move in a way such that the main-FOV can cover a second portion of the care area that is stitched with the first portion of the care area after stepping. This stepping and scanning process can be repeated until the entire care area is covered.

Figure 7B:
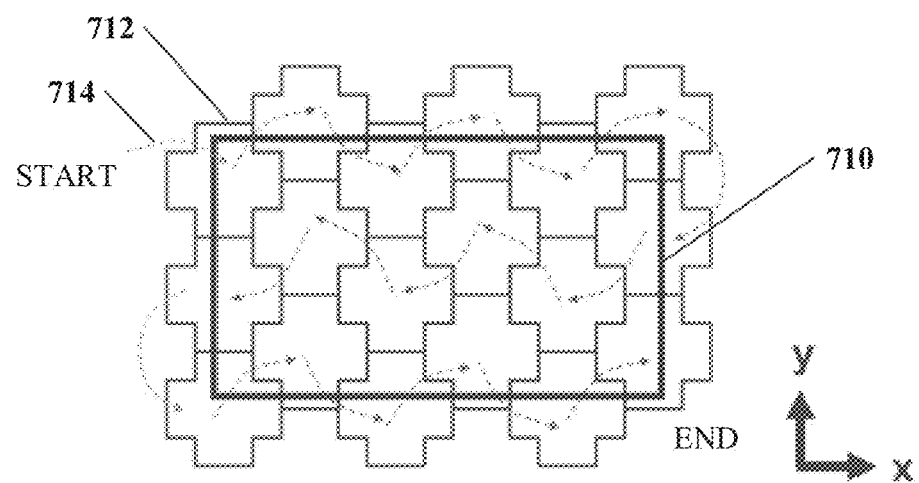
FIG. 7B is a diagram of an example care area divided for imaging in a step-and-scan mode according to implementations of this disclosure.

For example, as shown in FIG. 7B, a care area 710 is in a rectangular shape. For inspection of the care area 710, multiple sections can be used, including a section 712. The multiple sections can cover a region larger than or equal to the care area 710. Each section can be covered by a main-FOV (e.g., the main-FOV 706) of the 2D beamlets. In some implementations, based on the shape and size of the main-FOV 706, the 2D beamlets can be generated using the multi-aperture plate 702 in FIG. 7A, in which the main-FOV 706 can cover the section 712. In some other implementations, other shapes and configurations of multi-aperture plates can be used to generate the 2D beamlets to cover a section for inspecting the care area. In an implementation, as shown in FIG. 7B, the substrate stage can move in a way such that the main-FOV 706 can move in accordance with a stepping path (or sequence) 714. Following the arrows of the stepping path 714 from a start point to an endpoint as shown in FIG. 7B, the main-FOV 706 can sequentially cover each section similar to the section 712 to inspect the care area 710, until all of the care area 710 is covered. In some implementations, when the actually-inspected region is larger than the care area (e.g., the scenario shown in FIG. 7B), the generated image can be filtered (or "cropped") to discard image portions outside the care area, in which only image portions corresponding to the care area will be processed for defect inspection or image measurement.

Figure 8A:
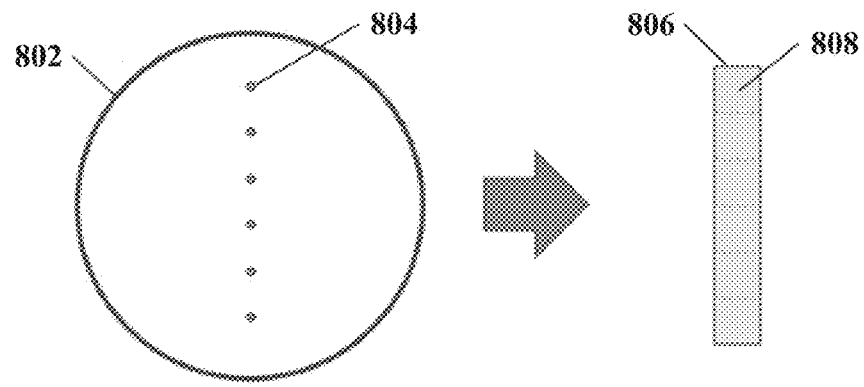
FIG. 8A is a diagram of an example multi-aperture plate and a FOV of corresponding beamlets according to implementations of this disclosure.

In some implementations, linearly-arranged (1D) beamlets can be used to inspect the substrate in the step-and-scan mode. For example, as shown in FIG. 8A, a multi-aperture plate 802 can include a linearly-arranged aperture array in a straight-line arrangement. The linearly-arranged aperture array includes multiple apertures, including an aperture 804. Multiple linearly-arranged beamlets (e.g., in the straight-line arrangement) can be generated using the multi-aperture plate 802. The linearly-arranged beamlets can have a main-FOV 806 on a substrate surface, which includes multiple sub-FOVs including a sub-FOV 808. The sub-FOVs can correspond to respective individual beamlets of the linearly-arranged beamlets. For example, the sub-FOV 808 can correspond to an individual beamlet generated by the aperture 804. In some implementations, the main-FOV 806 can be rectangular and its sub-FOVs (such as the sub-FOV 808) can be square or rectangular. An actual size of the sub-FOV 808 on the substrate surface can be slightly overlapped, stitched with, or separated from its neighboring sub-FOVs. In some implementations, the quantity of the linearly-arranged beamlets can be greater than or equal to 2. In an implementation, the quantity of the linearly-arranged beamlets can be in a range from 2 to 200. In another implementation, the quantity of the linearly-arranged beamlets can be greater than 200.

Figure 8B:
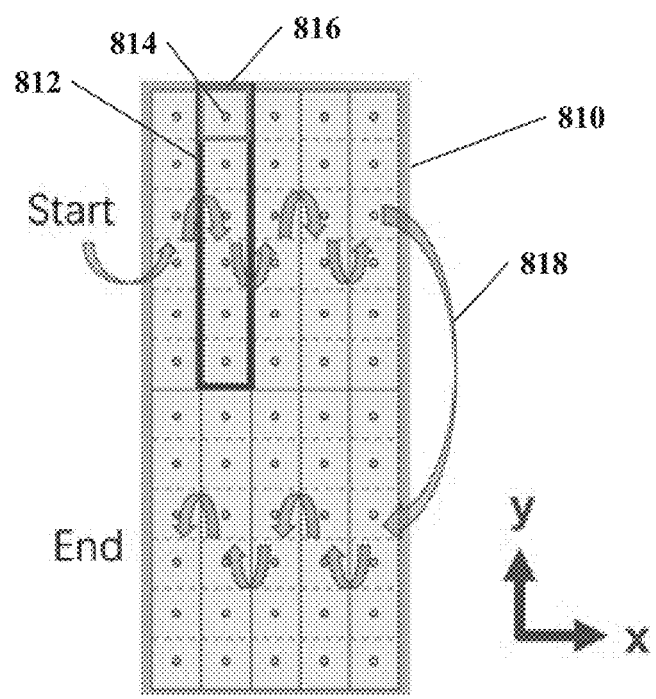
FIG. 8B is a diagram of an example care area divided for imaging in a step-and-scan mode according to implementations of this disclosure.

In some implementations, based on the shape and size of the main-FOV (e.g., the main-FOV 806) of the linearly-arranged beamlets, a rectangular care area on a patterned substrate can be divided into sections for inspection in the step-and-scan mode. For example, as shown in FIG. 8B, a care area 810 is rectangular and divided into multiple sections for inspection. In FIG. 8B, the care area 810 is divided into 10 rectangular sections, including a section 812. The section 812 is similar to other 9 divided sections in the care area 810. Each of the rectangular sections can be covered by a main-FOV (e.g., the main-FOV 806) of the linearly-arranged beamlets. In an implementation, the linearly-arranged beamlets can be generated using the multi-aperture plate 802 in FIG. 8A, and the main-FOV 806 can cover the section 812.

In some implementations, the shape and size of the section 812 can be determined based on the quantity and arrangement of the beamlets and sub-FOV sizes of each beamlet. For example, based on the configuration of care area division as shown in FIG. 8B, beamlets for imaging the section 812 includes 6 linearly-arranged individual beamlets, including an individual beamlet 814. A sub-FOV (e.g., the sub-FOV 808 in FIG. 8A) of each individual beamlet can be larger than, matching to, or smaller than its corresponding sub-section (e.g., the sub-section 816 in FIG. 8B). In FIG. 8B, the arrangement of the linearly-arranged beamlets including 6 individual beamlets with square sub-FOVs is chosen for ease of explanation of the implementation without causing any redundancy or ambiguity. Typically, the shape of a sub-FOV (e.g., the sub-FOV 808 in FIG. 8A) corresponding to the sub-section 816 can be rectangular or square.

During the step-and-scan mode, in an implementation, the section 812 can be scanned by all the beamlets with the main-FOV 806 in FIG. 8A. When the scan of the section 812 is finished, the substrate stage can step to a next section (e.g., an adjacent or non-adjacent section) followed by a next scanning. In an implementation, as shown in FIG. 8B, the path or sequence of the stage stepping can be set in accordance with a predetermined order, such as, for example, a stepping path 818 or any other path. As shown in FIG. 8B, following arrows of the stepping path 818, the imaging scan first starts from a starting point of the stepping path 818 and then traversed through each of the 10 sections of the care area 810 for scanning until an endpoint. Although the substrate stage in FIG. 8B steps following the stepping path 818, the scanning of each of the 10 sections can be performed in any combination of spatial orders or directions (e.g., the "x-direction" or "y-direction" as shown in FIG. 8B). In some implementations, each section of the care area can be scanned for once during the inspection. In another implementation, each section of the care area can be scanned for multiple times during the inspection.

Typically, the throughput of a multi-beam imaging system can be increased (in some cases, significantly increased) compared with single-beam systems. However, some multi-beam imaging systems using the step-and-scan mode still provide insufficient throughput for in-line application. A limiting factor for the step-and-scan mode is time for stage settling. The substrate stage typically vibrates after stepping. It takes time for the vibration to stop or attenuate to a certain extent before the next scanning can start. The vibration can cause degradation of imaging quality of the scanned section. In some multi-beam imaging systems working in the step-and-scan mode, the time for the substrate stage to settle between stepping ("settling time") can be long. Typically, in those systems, the settling time can be longer than (in some cases, by an order of magnitude) the time for scanning a section ("scanning time") of the care area. For example, for a pixel rate of 100 MHz, the scanning time for a 1024×1024 image is slightly over 10 milliseconds (ms), while the stage stepping and settling time can be over 150 milliseconds (ms). The long settling time of the substrate stage can become a potential bottleneck to the inspection throughput of those multi-beam imaging systems.

The multi-beam imaging systems as described herein can work in a continuous scan mode (e.g., in addition to a step-and-scan mode) to further increase the inspection throughput. In the continuous scan mode, the substrate stage keeps moving in one direction at a constant speed while the e-beam or beamlets, driven by deflectors, can scan the care area, without interrupting the motion of the stage. For example, the e-beam or beamlets can be driven to perform a line scan on the care area. The trace of the line scan can be referred to as a "scan line" herein. Typically, there are two ways to drive the deflectors for raster scanning: (i) the scan line is perpendicular to the stage motion direction; (ii) the scan line is parallel to the stage motion direction.

Figure 9A:
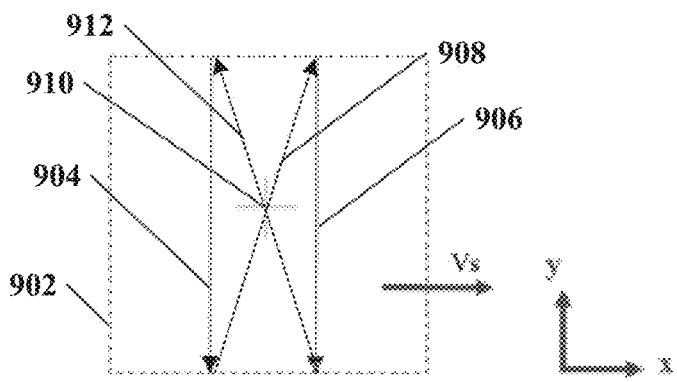
FIG. 9A is a diagram of an example scanning region with raster scanning in a continuous scan mode according to implementations of this disclosure.

In some implementations, the scan line can be perpendicular to the stage motion direction in the continuous mode of the multi-beam imaging system. For example, as shown in FIG. 9A, an e-beam or beamlets is performing a raster scan for a scanning region 902 of a patterned substrate while a substrate stage is moving at a constant speed $V_s$ along an x-axis. The e-beam or beamlets can be, for example, the individual beamlet 814 in FIG. 8B. The scanning region 902 can be a section (e.g., the section 812 in FIG. 8B) or a sub-section (e.g., the sub-section 816 in FIG. 8B) of a care area of the substrate.

FIG. 9A shows two line scan paths on the surface of the scanning region 902, which correspond to two line scans performed by the beamlet: a first line scan path 904 and a second line scan path 906. The line scan paths have a vertical direction from up to down along a y-axis. After one line scan is finished, the beamlet can moves, as shown by a resetting paths 908, in a raster scanning manner to start a next line scan, the process of which can be repeated for multiple times (e.g., two times). After the multiple line scans having been performed, the beamlet can moves, as shown by a resetting path 912, back to the starting point of the first-time line scan path to start the next set of multiple line scans. The area covered by each set of the multiple line scans can be referred to as a "frame," and the multiple line scans to cover a frame can be referred to as a "frame scan." The direction of the frame scan can be perpendicular to the line scan.

For example, as shown FIG. 9A, a frame scan includes two line scans—that is, the beamlet moves to perform a first frame scan along the line scan path 904, the resetting path 908, and the line scan path 906, and then moves to start a next frame scan along the resetting path 912. Although the frame scan in FIG. 9A includes only two line scans (or, the frame shown in FIG. 9A includes only two lines), any number of line scans can be included in a frame scan.

Figure 9B:
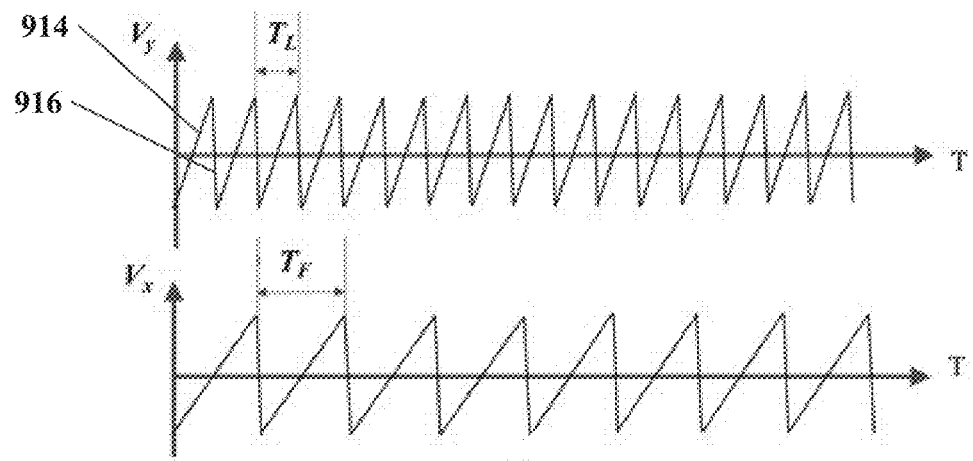
FIG. 9B is a diagram of example scan signals in a continuous scan mode according to implementations of this disclosure.

The beamlet can be driven by a deflector set to perform the line scans. The deflector set can include multiple deflectors along any direction. Each deflector can be applied with a scan signal (e.g., a voltage) for driving the beamlet. For example, as shown in FIG. 9B, line scans corresponding to the line scan paths 904 and 906 can be controlled or driven using a saw-teeth scan signal $V_y$. In some implementations, $V_y$ can be a time variant voltage signal. For example, as shown in FIG. 9B, $V_y$ can be a periodical voltage signal with a period $T_L$. Each period of $V_y$ includes a first portion (or "scanning portion") for controlling the beamlet to perform a line scan in a first direction and a second portion (or "resetting portion") for resetting the beamlet in a second direction (e.g., opposite to the first direction) to perform a next line scan. The "first" and "second" herein are for indicating purpose only, and not referring to the order of the portions of the voltage signal. For example, as shown in FIG. 9B, a period of $V_y$ includes a first portion 914 and a second portion 916. In an implementation, the first portion 914 can be used to drive the beamlet to move along the line scan path 904, and the second portion 916 can be used to drive the beamlet to move along the resetting path 908 to position the beamlet at a starting point of the line scan path 906. The first portion 914 has a steeper slope than the second portion 916, which represents the beamlet moves in a slower speed when scanning (e.g., along the line scan path 904) and moves in a faster speed when being reset (e.g., along the resetting path 908) for performing the next line scan. A change of the direction of $V_y$ (e.g., at a wave peak or a wave trough) represents a change of the direction of the driven beamlet. When $V_y$ periodically changes, the beamlet can scan the scanning region 902 in a raster scanning manner. The period $T_L$ of $V_y$ can then be set as equal to a time period between the starting or ending of two immediately consecutive line scans.

To perform the frame scan, as shown in FIG. 9B, the beamlet can further be controlled using an additional saw-teeth scan signal $V_x$. In some implementations, $V_x$ can be a time variant voltage. For example, as shown in FIG. 9B, $V_x$ can be a periodical voltage with a period $T_F$. Similar to $V_y$, each period of $V_x$ also includes a scanning portion and a resetting portion. When $V_x$ periodically changes, the beamlet can correspondingly moves back to the starting point of the first line of the frame to start a next frame scan.

In some implementations, $T_F$ can be set equal to $T_L$, in which each frame scan includes one line scan. In some implementations, $T_F$ can be greater than $T_L$, in which each frame scan can include more than one line scan. When $T_F$ is greater than $T_L$, the scanning portions of $V_x$ can have a gentler slope than the scanning portions of $V_y$. For example, as shown in FIG. 9B, $T_F=2T_L$, and the slope of the scanning portions of $V_x$ is one half of the slope of the scanning portions of $V_y$. The period $T_F$ of $V_x$ can be set as equal to a time period between the starting or ending of two immediately consecutive frame scans. By controlling the values and the change patterns of $V_x$ and $V_y$, the frame scan and line scans included therein can be performed in any manner, such as in different sizes of covered area, in any speed, or along any path. For example, in FIG. 9A, when $V_x \neq 0$ and $V_y=0$, the beamlet is at a point 910.

In the continuous scan mode, $V_s$ can be set based on $V_x$ and $V_y$. In some implementations, to avoid or reduce image distortion, $V_s$ can be determined based on a physical size corresponding to a portion (e.g., a pixel) of the generated image and the number of lines included in one frame. A pixel of the generated image can correspond to a physical portion (referred to as a "physical pixel") of the frame scan performed on the substrate surface. The size of the physical pixel can be referred to as the "physical pixel size" or simply "pixel size." The pixel size can depend on the physical size and the pixel dimension of the image. The pixel size can also be different in the horizontal and vertical directions. For example, if the physical size of the image is A×B (e.g., 3 mm×2 mm) and the pixel dimension of the image is m×n (e.g., 300 pixels×400 pixels), then the pixel size in the horizontal direction ($P_h$) is $P_h=A/m$ (e.g., $P_h=3$ mm/300=0.01 mm), and the pixel size in vertical direction ($P_v$) is $P_v=B/n$ (e.g., $P_v=2$ mm/400=0.005 mm). In some implementations, the pixel size of the generated image can be the same in the horizontal and the vertical directions, i.e., $P_h=P_v=P$.

A line scan can generate a line of pixels in the generated image (e.g., m image pixels), each pixel corresponding to a physical pixel having a pixel size P. In other words, the physical size (or length) covered by the line scan corresponding to the line of pixels is A=m×P. If the time needed for scanning a physical pixel is $T_P$, then $T_L$=m×$T_P$. For a square frame scan, the frame scan can include m lines. In other words, the physical size (or area) covered by the frame scan is A×A, and the pixel dimension of the generated image of the frame scan is m×m. In some implementations, the pixel dimension m×m can be limited by image resolutions on the boundaries of the frame scan. The pixel size P (or the corresponding physical size A) can be limited by physical limitations or conditions of the system (e.g., optical aberrations).

For example, suppose the line scan is in vertical directions, in some implementations, a frame scan can cover a vertical physical line with a horizontal width on the substrate surface, which can generate a vertical line of image pixels of the scan image. In an implementation, a frame scan can cover a horizontal width of a vertical line of physical pixels (referred to as a "physical line"), each physical pixel with a pixel size P. When there are N lines in the frame and the line scan period is $T_L$, $V_s$ is in the horizontal direction and can be determined as Eq. (1):

$$V_s = \frac{P}{T_L \times N} = \frac{P}{T_F} \quad \text{Eq. (1)}$$

In Eq. (1), the frame scan period $T_F$=$T_L$×N. In the time duration of $T_F$, a frame scan including N line scans can be performed to cover the physical line, the results of which can be used to generate a line of pixels of the generated image. In other words, the physical line can be scanned for N times for generating the line of pixels in the scan image.

In an implementation, a frame can include one line (e.g., each frame scan covers a physical line), or N=1. In other words, the line scan is equivalent to the frame scan. In this implementation, when $V_s$=P/$T_L$, the continuous scan can generate a strip-shaped image, and no physical line on the substrate surface is scanned for more than once to generate the strip-shaped image (i.e., the frame scan covers no overlapped physical line between consecutive frames).

In another implementation, a frame can include multiple lines (e.g., each frame scan covers multiple physical lines), or N>1. In this implementation, when $V_s$<P/$T_L$, each physical line can be scanned for multiple times in a frame scan. For example, $V_s$ can be set as $$\frac{1}{N} \frac{P}{T_L}$$

(N=1, 2, 3, 4, . . . ). Each physical line can be line scanned for N times in a frame scan, and each frame of a continuous scan (except the first and the last frame of the continuous scan) can be frame scanned for N times. For each line scan of the physical line, a line scan signal can be generated (e.g., a binary value, an integer value, or an RGB value), and the N line scan signals can be summed and averaged to generate an average signal for the physical line. The average signals of the line scans can be used to generate an average scan image.

For another example, when N=$2^k$ (k=0, 1, 2, 3, . . . ) and $V_s$=P/($T_L$×N), each frame includes N lines (or, each frame scan includes N line scans). Each line can have a horizontal physical size of $$\frac{P}{N}.$$

The N line scans or the frame scan can be labeled as line scan 1, line scan 2, . . . , line scan N. The frame scans cover a region with a horizontal width of $$\frac{N-1}{N} \cdot P$$

overlapped between consecutive frames. In this example, except for the first and last frame of the continuous scan, each of the $2^k$ lines in each frame can be scanned for N times. For example, the line scan 1 can be used to generate a first strip-shaped image, the line scan 2 can be used to generate a second strip-shaped image, and so on. A total of N strip-shaped images can be obtained. Because each of the N strip-shaped images can be shifted by $$\frac{P}{N}$$

from its adjacent or neighboring strip-shaped image, the N strip-shaped images can cover an overall strip area larger than a strip area of a single strip-shaped image. For example, the overlapped portion of the N strip-shaped images can be used to generate a final image. For another example, image pixels of the N strip-shaped images can be matched with positions (e.g., a physical pixel) on the substrate surface. The matching can be either exact or with an ignorable shifting error. Image data of the image pixels corresponding to the same position of the substrate surface can be summed and averaged to generate average image data for that position. The average image data can be used to generate a final image, by which noise cancelation and signal-to-noise ratio can be improved.

For another example, when N=2 and $V_s$=0.5 P/$T_L$, the frame scan can include two line scans: line scan 1 and line scan 2. Between two consecutive frame scans, such as frame scan $k^{th}$ and frame scan $(k+1)^{th}$, the line scan 2 of the frame scan $k^{th}$ and the line scan 1 of the frame scan $(k+1)^{th}$ can scan the same physical line. First pixels of the image generated from the line scan 1 and second pixels of the image generated from the line scan 2 can correspond to the same or almost the same (i.e., with ignorable shifting errors) physical positions of the physical line. By averaging the pixel data of the first and second pixels, an average image can be produced.

Figure 10A:
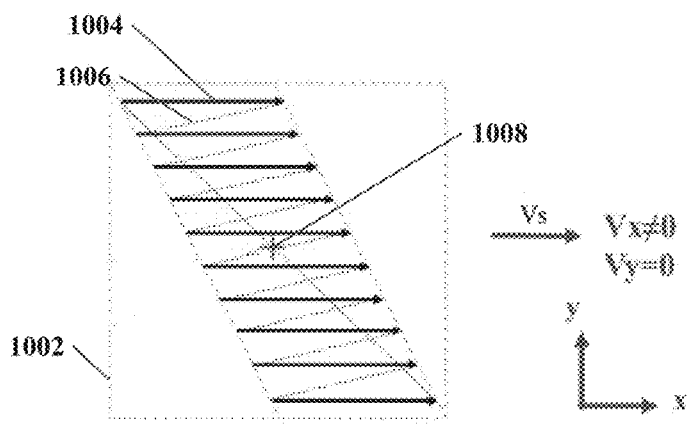
FIG. 10A is a diagram of another example scanning region with raster scanning in a continuous scan mode according to implementations of this disclosure.

In some implementations, the scan line can be parallel to the stage motion direction in the continuous mode of the multi-beam imaging system. In these implementations, a frame scan including more than one line scans can be used to achieve a 2D scan. For example, as shown in FIG. 10A, a single electron beamlet is performing a raster scan for a scanning region 1002 of a patterned substrate while a substrate stage is moving at a constant speed $V_s$ along an x-axis. The e-beam or beamlets can be, for example, the individual beamlet 814 in FIG. 8B. The scanning region 1002 can be a section or a sub-section of a care area of the substrate, such as, for example, the sub-section 816 in FIG. 8B. In FIG. 10A, multiple line scans performed by the beamlet are shown, including a line scan 1004. The line scans have a direction from left to right along an x-axis, parallel to $V_s$. In some implementations, for example, the scanning region 1002 can be covered by a frame scan including 10 line scans as shown in FIG. 10A. Although 10 line scans are shown as an example in the frame scan, any number of line scans can be included in the frame scan, such as 512, 1024, 2048, or any other number.

Figure 10B:
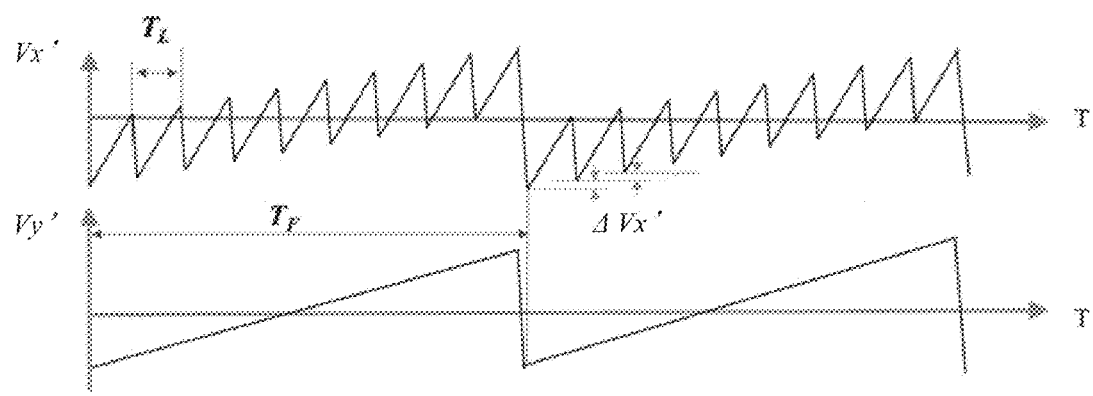
FIG. 10B is a diagram of example scan signals in a continuous scan mode according to implementations of this disclosure.

As shown in FIG. 10B, the line scans including the line scan 1004 can be implemented and controlled using a saw-teeth scan signal $V_x'$ and an additional saw-teeth scan signal $V_y'$. In some implementations, $V_x'$ and $V_y'$ can be time variant voltages along the x-direction and y-direction, respectively. For example, as shown in FIG. 10B, $V_x'$ can be a periodical voltage along the y-direction with a period $T_L$ (representing the time needed for a line scan) and $V_y'$ can be a periodical voltage along the y-direction with a period $T_F$ (representing the time needed for a frame scan). In some implementations, $T_F$ can be greater than or equal to $T_L$. Similar to $V_x$ and $V_y$ in FIG. 9B, $V_x'$ and $V_y'$ can include scanning portions and resetting portions. In some implementations, the scanning portions of $V_y'$ can have a gentler slope than the scanning portion of $V_x'$. $V_y'$ can drive the beamlet to move along the y-axis. For example, as shown in FIG. 10A, when $V_x \neq 0$ and $V_y = 0$, the beamlet can be centered at a point 1008.

Within each period of $V_x'$, there is a first (scanning) portion and a second (resetting) portion. For example, the scanning portion of $V_x'$ can drive the beamlet to perform the line scan 1004, and the resetting portion of $V_x'$ can drive the beamlet to move along a resetting path 1006 to position the beamlet to a starting point for a next line scan. When $V_x'$ periodically changes with time, the beamlet can scan the scanning region 1002 from left to right. The period $T_L$ of $V_x'$ can then be equal to a total time for performing the line scan (e.g., the line scan 1004) plus resetting the beamlet (e.g., along the resetting path 1006) for a next line scan. When $V_y'$ periodically changes with time, the beamlet can traverse the scanning range 1002 from up to down.

Because the substrate stage is moving, to keep an imaging area as a rectangular shape, a jump $\Delta V_x'$ as shown in FIG. 10B can be applied to $V_x'$ for shifting the starting point of the next line scan. In an implementation, half of the line scan capability can be reserved for the purpose of shifting the line scan starting points. For example, for square physical pixels, the line scan can cover m physical pixels, while the frame scan can include 2m line scans. As shown in FIG. 10B, $V_y'$ has a period longer than $V_x'$, representing a relatively slower scan rate. Each frame scan can shift from consecutive frame scans by a given dimension, such as by one physical pixel.

In an implementation, given the pixel size as P, the time for scanning a physical pixel as $T_P$, a line scan covering m physical pixels, a frame scan including 2m line scans, and the stage moving m physical pixels after the frame scan, to ideally stitch images generated from consecutive frame scans along the stage motion direction, the stage speed can be set as $$V_s = \frac{m \times P}{T_F} = \frac{m \times P}{2m \times T_L} = 0.5 \times \frac{P}{T_L}$$

in which $T_L = m \times T_P$.

Figure 10C:
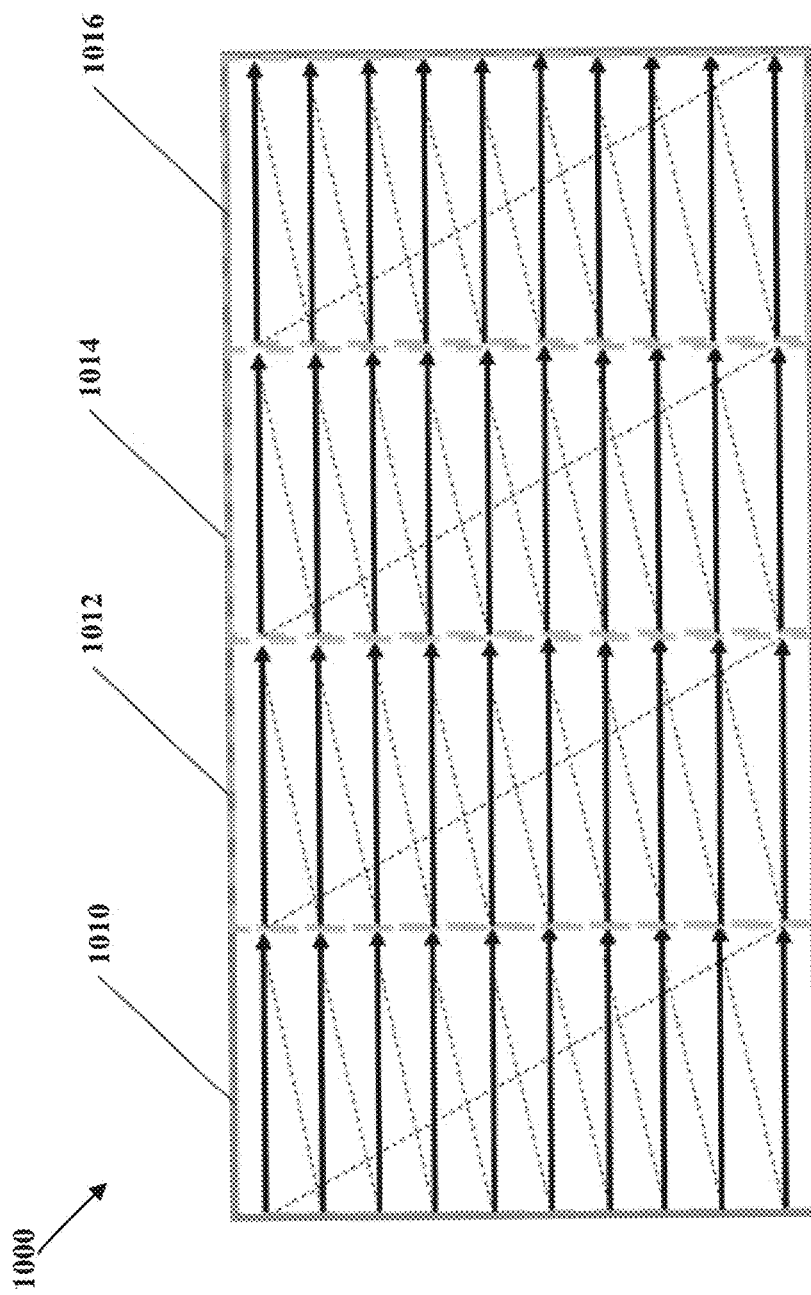
FIG. 10C is a diagram of an example strip-shaped image generated in a continuous scan mode according to implementations of this disclosure.

For example, as shown in FIG. 10C, with $V_s = 0.5\ P/T_L$ in the continuous scan mode, each frame scan can generate a rectangular segmented image, including segmented images 1010-1016. A strip-shaped image 1000 can be generated by stitching multiple consecutive segmented images. In some implementations, the strip-shaped image 1000 can be a non-strip-shaped image. In some implementations, the consecutive segmented images can have overlapped portions (e.g., overlapping by several physical pixels, which can be determined by $V_s$). In some implementations, the strip-shaped image 1000 can be generated by a non-stitching method.

For multi-beam imaging systems using linearly-arranged beamlets, the continuous scan mode for imaging or inspection can be made possible by moving a substrate stage in a constant speed in a direction (e.g., an x-direction) perpendicular to a direction (e.g., a y-direction) of the beamlets linearly arranged along. In some implementations, all beamlets can work in parallel to generate a strip-shaped image. For example, a width of the strip-shaped image can be determined by the quantity of the beamlets and a width of a line scan width associated with each beam. For another example, a length of the strip-shaped image can be determined by the care area or stage control units. With the stage settling time minimized, the inspection throughput can be greatly improved.

In an implementation, multi-beam imaging systems equipped with a linearly-arranged aperture array can work in the continuous scan mode. In another implementation, the multi-beam imaging systems can be selected to work in the continuous scan mode or the step-and-scan mode. For example, the multi-beam imaging systems can switch between the continuous scan mode and the step-and-scan mode. In another implementation, the multi-beam imaging systems can switch to use a single beam. For example, the multi-beam imaging systems can switch to use different beam-splitting devices to generate a single beam or multiple beamlets.

FIG. 11A shows an example care area 1100 scanned by strip-shape sections ("strips") using multiple beamlets in the continuous scan mode. As shown in FIG. 11A, the care area 1100 is divided into 5 parallel strips, including a strip 1102. The strip 1102 is similar to the other 4 strips in the care area 1100 and will be described hereinafter as an example for ease of explanation without causing any redundancy or ambiguity. It should be noted that the care area 1100 can be divided into any number of strips based on the number of beamlets for scanning one strip and scan widths of each beamlet. In an implementation, as shown in FIG. 11A, the strip 1102 is scanned by 11 linearly-arranged beamlets, the scanning region of each beamlet forming a corresponding sub-strip. The beamlets or sub-strips can be of any number in any configuration, depending on the number and configuration of the apertures in the multi-aperture plate. In an implementation, the strip 1102 can be scanned by the 11 beamlets for generating 11 strip-shaped images. The 11 strip-shaped images can be stitched to generate a combined strip image for the strip 1102.

In an implementation, the combined scanning regions of the beamlets (e.g., the 11 beamlets) can be equal to the area of a strip (e.g., the strip 1102) for performing a full sampling (i.e., a 100% coverage of the scanning region). In another implementation, the strip can be chosen to be smaller than the combined scanning regions of the beamlets for performing a percentage sampling (i.e., less than 100% coverage of the scanning region). In another implementation, the strip can be chosen to be larger than the combined scanning regions of the beamlets for performing an oversampling (i.e., more than 100% coverage of the scanning region). The oversampling can be used, for example, when some defects are located at a boundary of the scan image and cannot be detected if full sampling is used due to alignment shift.

FIG. 11B shows a portion 1104 of the strip 1102 in an enlarged view. The portion 1104 includes 5 sub-strips for 5 beamlets to scan, including a sub-strip 1106. The sub-strip 1106 is similar to the other 4 sub-strips in the portion 1104 and will be described hereinafter as an example for ease of explanation without causing any redundancy or ambiguity. In an implementation, the sub-strip 1106 can be scanned by a beamlet 1108 for generating a strip-shaped image. The strip-shaped image of the sub-strip 1106 can be stitched with adjacent strip-shaped images generated by adjacent scanning beamlets.

In an implementation, the scanning region of the beamlet 1108 can be equal to the area of the sub-strip 1106 for performing the full sampling. In another implementation, the sub-strip 1106 can be chosen to be smaller than the scanning region of the beamlet 1108 for performing the percentage sampling. In another implementation, the sub-strip 1106 can be chosen to be larger than the scanning region of the beamlet 1108 for performing the oversampling.

In the continuous scan mode of multi-beam imaging system, in an implementation, the substrate stage can carry the substrate to move at a constant speed in a direction 1110. While the substrate is moving, the beamlets can be controlled to scan the strip 1102 along with a scanning path 1112 (e.g., starting from the left end of the strip 1102 and continued as a head-to-tail fashion). The e-beam scan for each strip (e.g., the strip 1102) of the care area 1100 can generate a combined strip-shaped image. The combined strip-shaped image can be obtained by performing the scan in a way as shown and described in FIGS. 9A-9B in which the line scan is performed perpendicular to the scanning path 1112 (i.e., in the y-direction shown in FIG. 11A), or in a way as shown and described in FIGS. 10A-10C in which the line scan is performed parallel to the scanning path 1112 (i.e., in the x-direction shown in FIG. 11A). When the beamlets reached an end position of the strip 1102 (e.g., when the beamlets reach the right end of the strip 1102), the substrate stage can move to an end of another strip (e.g., the right or left end of an adjacent or non-adjacent strip) to repeat the scanning procedure. For example, by following the scanning path 1112, the care area 1100 can be scanned strip by strip in a continuous fashion, in which the need for stopping and settling the stage can be reduced.

Figure 12:
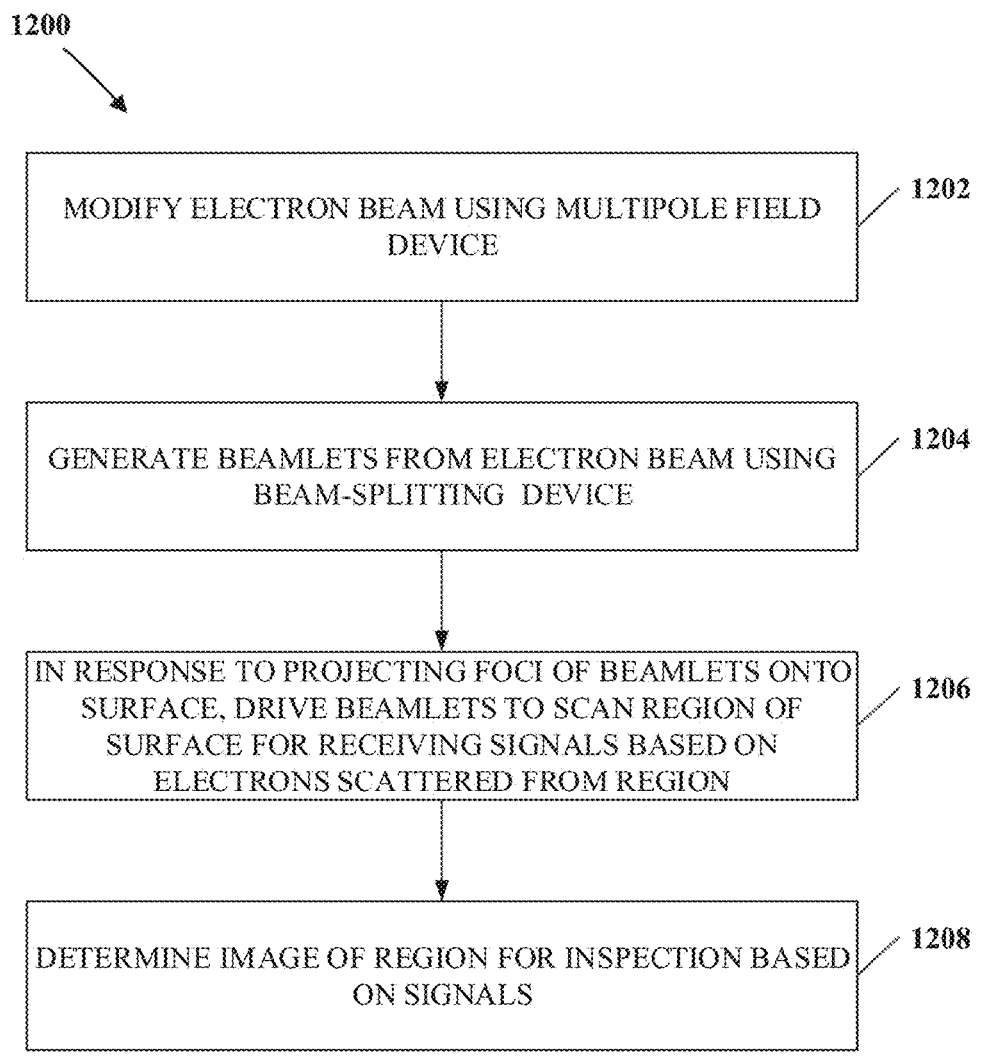
FIG. 12 is a flowchart of an example process for imaging a surface of a substrate using a multi-beam imaging system according to implementations of this disclosure.

In this disclosure, a method for imaging a surface of a substrate using a multi-beam imaging system is also provided. FIG. 12 is an example process 1200 for multi-beam imaging using a multi-beam imaging system capable of working in a step-and-scan mode and a continuous scan mode. The process 1200 can be implemented as software and/or hardware modules in the system 100 in FIG. 1 or the system 200 in FIG. 2. For example, the process 1200 can be implemented as modules included in the system 100 or the system 200 by one or more apparatuses. The process 1200 includes operations 1202-1208 set forth as follows.

At operation 1202, an e-beam is modified using a multipole-field device. For example, the e-beam can be the primary beam 2021 in FIG. 2, and the multipole-field device can be the multipole-field device 206 in FIG. 2.

In an implementation, the e-beam can be generated from an electron source. The e-beam can have an essentially round beam spot. For example, the electron source can be the electron source 202 in FIG. 2. In some implementations, an electrode set (e.g., the electrode set 204 in FIG. 2) can be used to extract, collimate, and/or focus the e-beam. The essentially round beam spot can be similar to a beam spot with the shape 302 in FIG. 3.

In an implementation, the multipole-field device can extend the essentially round beam spot along a first direction aligned with the linearly-arranged apertures and suppress the essentially round beam spot along a second direction orthogonal to the first direction. For example, the multipole-field device (e.g., the multipole-field device 206) can be used to change the shape of the beam spot, such as, from a round primary beam (e.g., the shape 302 in FIG. 3) to an elliptical shape (e.g., the shape 304 in FIG. 3). In some implementations, the multiple-field device can further correct aberrations of the e-beam.

In an implementation, the multipole-field device can include one or more stages and each stage generates a multipole electric field and/or a multipole magnetic field. The number of the multipoles of the multipole electric/magnetic field can be 4, 6, 8, 10, 12, or any other number.

At operation 1204, beamlets are generated from the modified e-beam using a beam-splitting device. For example, the beam-splitting device can be the beam-splitting device 2082 in FIG. 2. In some implementations, the beam-splitting device can have any number of apertures in any configuration, such as shown in FIGS. 4A-4F. For example, the beam-splitting device can have linearly-arranged apertures (e.g., the multi-aperture plate 402 in FIG. 4A-4C), in which the modified (or, in some cases, unmodified) e-beam can cover at least a portion of the apertures.

In some implementations, structures of the beam-splitting device can include different layers, such as the multi-aperture plates 500A in FIG. 5A or the multi-aperture plate 500B in FIG. 5B. The layers of the beam-splitting device can have different functions. For example, the first layer 502 can limit the beamlet size. For another example, the layer 504 can have different foci and thus focus beamlets generated at different plate positions onto the same plane with reduced aberration. For another example, the third layer 512 can converge the beamlets incident to the first layer 502. It should be noted that to implement the same or similar functions, the structures of the beam-splitting device can use any number of layer designs in any configuration, profile, or dimensions.

In some implementations, the beam-splitting device can have predetermined sets (e.g., 2, 3, 4, or any number) of apertures arranged on different regions of the beam-splitting device for different working modes. For example, the beam-splitting device can be a multi-aperture plate. The predetermined sets of apertures can include at least one of a single aperture, a one-dimensional aperture array (i.e., linearly-arranged apertures), or a two-dimensional aperture array. The sets of apertures are switchable, such as by switching the predetermined sets of apertures for use via a moving mechanism. The moving mechanism can be a rotating method for rotating the beam-splitting device. The moving mechanism can also be replacing the beam-splitting device.

For example, the multi-aperture plate 600 in FIG. 6 have sets of apertures (i.e., the multiple apertures 602 and the single aperture 604). The multiple apertures 602 can be used in a multi-beam imaging mode, and the single aperture 604 can be used in a single-beam imaging mode. The multi-aperture plate 600 can switch between the sets of apertures (e.g., by rotating the multi-aperture plate 600 to expose different sets of apertures under coverage of the e-beam).

At operation 1206, the beamlets are driven to scan a region of the substrate surface. Foci of the beamlets can be projected onto the substrate. The beamlets can be driven using a deflector set. Electrons scattered from the region can form scatter beamlets and be deflected and received by a detector for generating signals. The signals can be processed by an image processing system for generating a scan image.

In an implementation, the beamlets can be projected onto the substrate using the projection lens set 210 and the objective lens set 216 in FIG. 2. In some implementations, additional components can be used to reduce aberration of the beamlets and improve imaging conditions. The additional components can include aberration correctors as set forth in the previous description, the optional aperture plate 212, additional electrostatic lenses (e.g., the first single-aperture electrode plate 2081 and the second single-aperture electrode plate 2083), or any other suitable projection device.

In an implementation, the deflector set can include one or more deflectors (e.g., the deflector set 214 in FIG. 2). The beamlets can be controlled by the deflector set to perform a raster scan for the substrate. In an implementation, the substrate is placed on a substrate stage controllable to move in a motion mode. The motion mode can include any combination of a step-and-scan mode and a continuous scan mode. In some implementations, when the substrate stage can move in at least two motion modes (e.g., the step-and-scan mode and the continuous scan mode), different motion modes can be selectable and switchable. For example, when the substrate stage is controlled to move in the step-and-scan mode, the beamlets can be driven to scan the region when the substrate stage settles. When the substrate stage is controlled to move in the continuous scan mode, the beamlets can be driven to scan the region when the substrate stage moves at a constant speed.

In an implementation, based on the motion mode of the substrate stage, operational parameters (e.g., the moving speed of the substrate stage) associated with the motion mode can be determined. For example, when the motion mode is selected as the step-and-scan mode or the continuous scanning mode, the operational parameters can be adjusted to optimize the corresponding motion mode.

For example, when the substrate stage is controllable to move in the continuous scan mode, the operational parameters can include the moving speed (e.g., a constant speed) of the substrate stage. The moving speed can be determined based at least on a ratio between a dimension of a sub-region (e.g., a physical pixel) of the scanned region (e.g., a pixel size of a physical pixel) on the substrate and a time duration of performing a line scan for the sub-region. An image pixel of the scan image can be generated from signals received based on electrons scattered from the sub-region. In some implementations, the moving speed can be determined further based on the number of line scans included in a frame scan. For example, the moving speed can be determined using Eq. (1).

In some implementations, in the continuous mode, a frame scan can be performed. When a frame scan includes multiple (e.g., N) line scans, each physical line of the frame can be scanned for N times. For each physical pixel of a physical line, N signals can be generated. The image pixel can be generated from average signal data of the physical pixel, which is generated by averaging the N signals.

In some implementations, in the continuous mode, the substrate stage can move at the constant speed in a stage motion direction. The line scans (e.g., included in a frame scan) can be performed in different directions with respect to the stage motion direction. For example, the line scans can be performed parallel to the stage motion direction. For another example, the line scans can be performed perpendicular to the stage motion direction.

In some implementations, for different motion modes of the substrate stage, different aperture arrays can be used. For example, a one-dimensional aperture array can be used for the continuous scan mode, a two-dimensional aperture array can be used for the step-and-scan mode, and a single aperture can be used for a single-beam scan mode.

In some implementations, the scatter beamlets can be deflected or bent by a deflecting device (e.g., the Wien filter set 224 in FIG. 2). The deflected scatter beamlets can be off-axis (e.g., the scatter beamlets 226 in FIG. 2).

In an implementation, the electron signal (e.g., the signal 230 in FIG. 2) can be generated by the detector (e.g., the detector 228 in FIG. 2) using the received deflected scatter beamlets. In some implementations, the detector 228 can be a detector array including multiple detectors.

At operation 1208, a scan image of the region of the substrate surface is determined for inspection based on the signals. For example, the image can be determined using the aforementioned image processing system.

Figure 13:
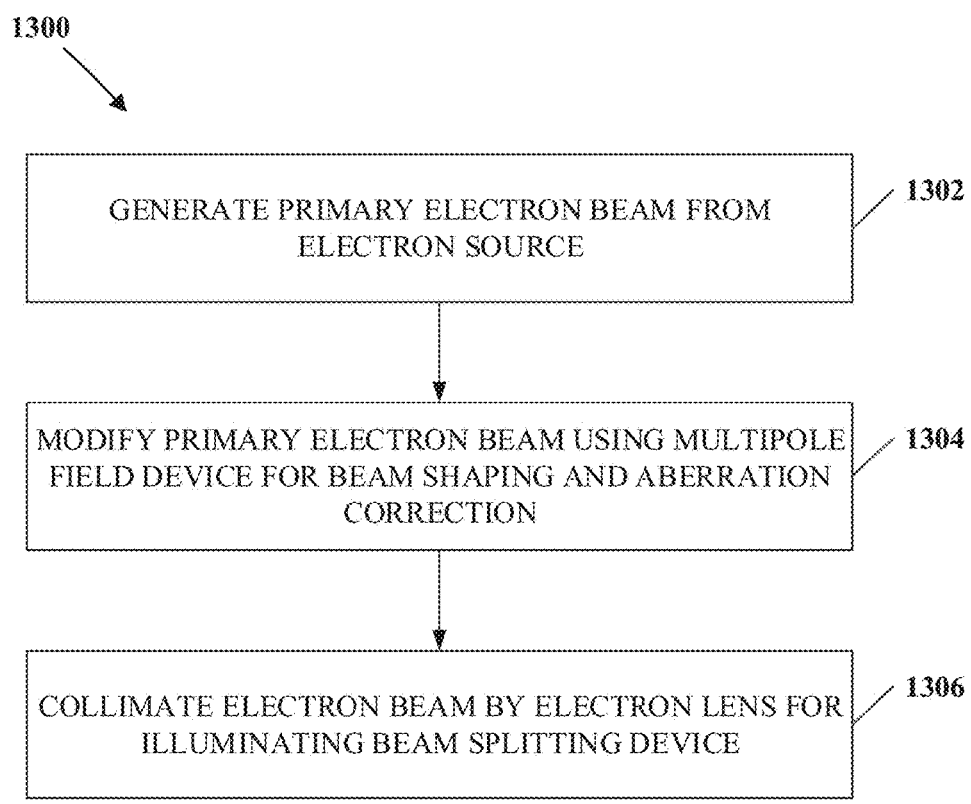
FIG. 13 is a flowchart of another example process for imaging a surface of a substrate using a multi-beam imaging system according to implementations of this disclosure.

In this disclosure, a method for imaging a substrate using multi-beam systems is provided. FIG. 13 is an example process 1300 for imaging a substrate using the multi-beam system. The process 1300 can be implemented as software and/or hardware modules in the system 100 in FIG. 1 or the system 200 in FIG. 2. For example, the process 1300 can be implemented as modules included in the system 100 or the system 200 by one or more apparatuses. The process 1300 includes operations 1302-1306, which is set forth as follows.

At operation 1302, a primary e-beam is generated from an electron source.

At operation 1304, the primary e-beam is modified using a multipole-field device for beam shaping and aberration correction.

At operation 1306, the e-beam is collimated by an electrostatic lens for illuminating a beam splitting device. In some implementations, the operation 1306 can be performed as a step prior to the operation 1204 in the process 1200.

The implementations herein can be described in terms of functional block components and various processing steps. The disclosed processes and sequences can be performed alone or in any combination. Functional blocks can be realized by any number of hardware and/or software components that perform the specified functions. For example, the described implementations can employ various integrated circuit components, e.g., memory elements, processing elements, logic elements, look-up tables, and the like, which can carry out a variety of functions under the control of one or more microprocessors or other control devices. Similarly, where the elements of the described implementations are implemented using software programming or software elements the disclosure can be implemented with any programming or scripting languages such as C, C++, Java, assembler, or the like, with the various algorithms being implemented with any combination of data structures, objects, processes, routines, or other programming elements. Functional aspects can be implemented in algorithms that execute on one or more processors. Furthermore, the implementations of the disclosure could employ any number of techniques for electronics configuration, signal processing and/or control, data processing and the like. The steps of all methods described herein can be performable in any suitable order unless otherwise indicated herein or otherwise clearly contradicted by context.

Aspects or portions of aspects of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device. Other suitable mediums are also available. Such computer-usable or computer-readable media can be referred to as non-transitory memory or media, and can include RAM or other volatile memory or storage devices that can change over time. A memory of a system described herein, unless otherwise specified, does not have to be physically contained by the system, but is one that can be accessed remotely by the system, and does not have to be contiguous with other memory that might be physically contained by the system.

In this disclosure, the terms "signal," "data," and "information" are used interchangeably. The use of "including" or "having" and variations thereof herein is meant to encompass the items listed thereafter and equivalents thereof as well as additional items. Unless specified or limited otherwise, the terms "mounted," "connected," 'supported," and "coupled" and variations thereof are used broadly and encompass both direct and indirect mountings, connections, supports, and couplings. Further, "connected" and "coupled" are not restricted to physical or mechanical connections or couplings.

The term "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion.

In addition, the articles "a" and "an" as used in this disclosure and the appended claims should generally be construed to mean "one or more" unless specified otherwise or clear from context to be directed to a singular form. Moreover, use of the term "an aspect" or "one aspect" throughout is not intended to mean the same implementation or aspect unless described as such. Furthermore, recitation of ranges of values herein is merely intended to serve as a shorthand method of referring individually to each separate value falling within the range, unless otherwise indicated herein, and each separate value is incorporated into the specification as if it were individually recited herein.

As used in this disclosure, the term "or" is intended to mean an inclusive "or" rather than an exclusive "or" for two or more elements it conjoins. That is unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. The term "and/or" used in this disclosure is intended to mean an "and" or an inclusive "or." That is, unless specified otherwise, or clear from context, "X includes A, B, and/or C" is intended to mean X can include any combinations of A, B, and C. In other words, if X includes A; X includes B; X includes C; X includes both A and B; X includes both B and C; X includes both A and C; or X includes all A, B, and C, then "X includes A and/or B" is satisfied under any of the foregoing instances. Similarly, "X includes at least one of A, B, and C" is intended to be used as an equivalent of "X includes A, B, and/or C."

The aspects shown and described herein are illustrative examples of the disclosure and are not intended to otherwise limit the scope of the disclosure in any way. For the sake of brevity, electronics, control systems, software development and other functional aspects of the systems (and components of the individual operating components of the systems) cannot be described in detail. Furthermore, the connecting lines or connectors shown in the various figures presented are intended to represent exemplary functional relationships and/or physical or logical couplings between the various elements. Many alternative or additional functional relationships, physical connections or logical connections can be present in a practical device.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for imaging a surface of a substrate using a multi-beam imaging system, comprising:
    modifying an electron beam using a multipole-field device, wherein the multipole-field device is coaxial with a source of the electron beam;
    generating beamlets from the modified electron beam using a beam-splitting device having multiple apertures;
    in response to projecting foci of the beamlets onto the surface, driving the beamlets using a deflector set to scan a region of the surface for receiving signals based on electrons scattered from the region; and
    determining an image of the region for inspection based on the signals.

2. The method of claim 1, wherein modifying a shape of the electron beam using the multipole-field device comprises:
    receiving the electron beam from an electron source, wherein a cross section of the electron beam has a round shape; and
    modifying the electron beam using the multipole-field device for beam shaping and beam aberration correction, wherein the cross section of the electron beam is modified into an elliptical shape.

3. The method of claim 1, further comprising:
    prior to generating the beamlets from the electron beam, collimating the electron beam using an electrostatic lens.

4. The method of claim 1, wherein the beam-splitting device comprises a multi-aperture plate, the multiple apertures comprises predetermined sets of apertures arranged on regions of the multi-aperture plate, and the multi-aperture plate is configured to be switchable between the predetermined sets of apertures for generating one of: a single beamlet for a single-beam scan mode, one-dimensional beamlets for a continuous scan mode, and two-dimensional beamlets for a step-and-scan mode.

5. The method of claim 1, wherein the multipole-field device modifies the electron bean by changing a cross-sectional shape of the electron beam.

6. A method for imaging a surface of a substrate using a multi-beam imaging system, comprising:
    modifying an electron beam using a multipole-field device;
    generating beamlets from the electron beam using a beam-splitting device having multiple apertures;
    in response to projecting foci of the beamlets onto the surface, driving the beamlets using a deflector set to scan a region of the surface for receiving signals based on electrons scattered from the region; and determining an image of the region for inspection based on the signals, wherein the substrate is placed on a substrate stage controllable to move the substrate for scanning in at least one of a step-and-scan mode and a continuous scan mode, wherein when the substrate stage is controlled to move in the step-and-scan mode, the beamlets are driven to scan the region when the substrate stage settles, and wherein when the substrate stage is controlled to move in the continuous scan mode, the beamlets are driven to scan the region when the substrate stage moves at a constant speed in a stage motion direction.

7. The method of claim 6, wherein the constant speed is determined based on a ratio between a dimension of a sub-region of the region and a time duration of performing a line scan for the sub-region, and a pixel of the image is generated from signals received based on electrons scattered from the sub-region.

8. The method of claim 7, wherein the pixel of the image is generated from average signal data generated by averaging a number of signals, each received based on the electrons scattered from the sub-region when performing a line scan of the number of line scans.

9. The method of claim 6, wherein when the substrate stage is controlled to move in the continuous scan mode, the beamlets are driven to perform line scans in one of: a direction parallel to the stage motion direction and a direction perpendicular to the stage motion direction.

10. A system for imaging a surface of a substrate using multiple electron beamlets, comprising:

an electron source, configured to generate an electron beam;

a first multipole-field device for beam shaping and beam aberration correction, configured to modify a cross section of the electron beam from a first profile to a second profile;

a beam-splitting device having multiple apertures, configured to generate and focus beamlets from the electron beam;

a projection lens set, comprising at least one projection lens, configured to project foci of the beamlets onto a region of the surface;

a deflector set, comprising at least one deflector, configured to drive the beamlets to scan the region;

an objective lens set comprising at least one objective lens, configured to focus the beamlets into beam spots on the surface;

a detector array, comprising at least one detector, configure to receive electrons scattered from the region to generate signals;

a second multipole-field device comprising an electromagnetic deflector, configure to deflect the electrons scattered from the region towards the detector set off a center axis of the beamlets;

a processor; and a memory coupled to the processor, the memory configured to store instructions which when executed by the processor become operational with the processor to determine an image of the region for inspection based on the signals.

11. The system of claim 10, further comprising:

an electrostatic lens upstream the beam-splitting device comprising at least one electrode plate, configured to collimate the electron beam;

an aperture plate downstream the projection lens, configured to block the electrons scattered from the region;

a substrate stage for placing the substrate, controllable to move the substrate for scanning in at least one of a step-and-scan mode and a continuous scan mode, wherein when the substrate stage is controlled to move in the step-and-scan mode, the beamlets are driven to scan the region when the substrate stage settles, and when the substrate stage is controlled to move in the continuous scan mode, the beamlets are driven to scan the region when the substrate stage moves at a constant speed; and an electronic control system for controlling parameters of at least one of the electron source, the electrostatic lens, the first multipole-field device, the beam-splitting device, the projection lens set, the deflector set, the objective lens set, the second multipole-field device, the substrate stage, the detector array, the processor, and the memory.

12. The system of claim 10, wherein the beam-splitting device comprises a multi-aperture plate comprising:

a first layer comprising first apertures, wherein the first apertures have a first size; and a second layer downstream the first layer and comprising second apertures, wherein the second apertures align with the respective first apertures and have second sizes larger than the first size, and wherein the size of a third aperture of the second apertures is larger than the size of a fourth aperture of the second apertures when the third aperture is closer than the fourth aperture to a center axis of the electron beam.

13. The system of claim 12, wherein the multi-aperture plate further comprises:

a third layer upstream the first layer and comprising third apertures, wherein the third apertures align with the respective second apertures and have third sizes larger than the first size and smaller than the respective second apertures, and wherein the size of a fifth aperture of the third apertures is larger than the size of a sixth aperture of the third apertures when the fifth aperture is closer than the sixth aperture to a center axis of the electron beam.

14. The system of claim 12, wherein the multi-aperture plate is biased to a voltage ranging from −20 kV to 20 kV.

15. The system of claim 12, wherein the multi-aperture plate comprises a first aperture array in a first region of the multi-aperture plate, and the first aperture array comprises at least one of: a one-dimensional array of apertures for a continuous scan mode, a two-dimensional array of apertures for a step-and-scan mode, and a single aperture for a single-beam scan mode.

16. The system of 15, wherein the multi-aperture plate further comprises a second aperture array in a second region of the multi-aperture plate, and wherein the second aperture array is different from the first aperture array, and the first aperture array and the second aperture array are switchable to be used for generating the beamlets from the electron beam.

17. The system of claim 10, wherein a voltage is applied between the surface of the substrate and an electrode of the objective lens to generate a surface extraction field for extracting the electrons scattered from the region, and a field strength of the surface extraction field ranging from 400 V/mm to 6000 V/mm.

18. The system of claim 17, wherein the objective lens set comprises an electrostatic lens and a magnetic lens, and at least one electrode of the objective lens set is biased to a voltage for controlling the surface extraction field.

19. The system of claim 10, wherein the first multipole-field device comprises at least one of a device capable of generating a multipole electric field, a device capable of generating a multipole magnetic field, and a device capable of generating a multipole electric-magnetic field, and the first multipole-field device has configurations of at least one of a quad-pole lens, an octa-pole lens, and a hexa-pole lens.

20. The system of claim 10, wherein the deflector set comprises a Wien filter, and the second multipole-field device comprises a Wien filter.

21. The system of claim 10, wherein the substrate is biased to a negative voltage with respect to a grounded magnetic lens polepiece.

* * * * *